United States Patent [19]

Iwamura

[11] Patent Number: 5,535,140
[45] Date of Patent: Jul. 9, 1996

[54] POLYNOMINAL-SET DERIVING APPARATUS AND METHOD

[75] Inventor: Keiichi Iwamura, Kawasaki, Japan

[73] Assignee: Canon Kabushiki Kaisha, Tokyo, Japan

[21] Appl. No.: 183,969

[22] Filed: Jan. 21, 1994

[30] Foreign Application Priority Data

| Jan. 22, 1993 | [JP] | Japan | 5-009333 |
| Jan. 22, 1993 | [JP] | Japan | 5-009334 |

[51] Int. Cl.$^6$ .................................................. G11C 29/00
[52] U.S. Cl. .......................................... 364/550; 371/40.1
[58] Field of Search ......................... 364/550; 371/37.1, 371/39.1, 38.1, 37.6, 40.1, 47.1, 37.5

[56] References Cited

U.S. PATENT DOCUMENTS

| 4,513,420 | 4/1985 | Collins et al. | 371/38 |
| 4,675,869 | 6/1987 | Driessen | 371/37 |
| 4,694,455 | 9/1987 | Koga | 371/37 |
| 4,698,813 | 10/1987 | Erdel | 371/40 |
| 4,754,458 | 6/1988 | Dornstetter | 371/40 |
| 4,841,300 | 6/1989 | Yoshida et al. | 371/37 |
| 5,343,481 | 8/1994 | Kraft | 371/37.1 |
| 5,365,529 | 11/1994 | Mester | 371/37.1 |

FOREIGN PATENT DOCUMENTS 0249982  12/1987  European Pat. Off. .

OTHER PUBLICATIONS

Kamiya and Miura: "A Recurrent Decoding Algorithm Relating to Some Sort of Algebraic Curve Codes", Technical Report of the Institute of Electronics and Communication Engineers of Japan, vol. IT91, No. 505, IT91–116, pp. 89–96, 1992.

Youzhi Xu: "Contributions to the Decoding of Reed–Solomon and Related Codes" Linköping Studies in Science and Technology. Dissertations No. 257, 1991.

Sakata: "Finding a Minimal Set of Linear Recurring Relations Capable of Generating a Given Finite Two–Dimensional Array", Symbolic Computation, 5, pp. 321–337, 1988.

L. R. Welch and R. A. Scholtz: "Continued Fractions and Berlekamp's Algorthm", IEEE Trans. Inf. Theory, IT–25, pp. 19–27, Jan. 1979.

A. N. Skorobogatov and S. G. Vladut: "On the Decoding of Algebraic Geometric Codes", IEEE Trans. Inform. Theory, vol. 36, No. 5, pp. 1051–1060, Sep. 1990.

S. Sakata: "Extension of the Berlekamp–Massey Algorithm to N Dimensions", Information and Computation, vol. 84, pp. 207–239, 1990.

Kamiya and Miura: "On the Application of the Sakata Algorithm for the Modified Decoding Algorithm Relating to Some Sort of Algebraic Curve Codes", Technical Report of the Institute of Electronics and Communication Engineers of Japan, vol. IT91, No. 435, IT91–96, pp. 47–54, 1992.

(List continued on next page.)

*Primary Examiner*—James P. Trammell
*Attorney, Agent, or Firm*—Fitzpatrick, Cella, Harper & Scinto

[57] ABSTRACT

A set of minimal polynomials for generating a multidimensional array for decoding algebraic geometric codes is derived at a high speed. In order to obtain a set of minimal polynomials F for generating a given multidimensional array, when sequentially updating a set of polynomials F, $df_n^{(i)}$ are not directly calculated, and a newly introduced set of polynomials B and the set of polynomials F are updated using the highest-degree coefficient $d_i$ of polynomials which belong to the set of polynomials B. An array memory for storing a given multidimensional array u, and first and second polynomial memories for storing the set of polynomials F to be obtained and a set of auxiliary polynomials G, respectively, are provided. In the calculation of polynomials $f^{(k)}$ and $df_{n+1}^{(k)}$, accessing operations for respective memories and accessed addresses are controlled in parallel depending on the degrees of polynomials $f^{(k)}$.

17 Claims, 11 Drawing Sheets

OTHER PUBLICATIONS

V. D. Goppa: "Codes on Algebraic Curves", Soviet Math. Dokl., 24, pp. 170–172, 1981.

V. D. Goppa: "Algebraic–geometric Codes", Math, U.S.S.R. Izvestiya, vol. 21, No. 1, pp. 75–91, 1983.

V. D. Goppa: "Geometry and Codes", Kluwer Academic Publishers, 1991.

M. A. Tsfasman and S. G. Vladut: "Algebraic–geometric Codes", Kluwer Academic Publishers, 1991.

J. Justesen, K. J. Larsen, E. Jensen, A. Havemose and T. Hoholdt: "Construction and Decoding of a Class of Algebraic Geometry Codes", IEEE Trans. Inform. Theory, vol. 35, No. 4, pp. 811–821, Jul. 1989.

Sakata: "Synthesis of a Two–dimensional Linear Feedback Shift Register for Generating a Given Two–dimensional Array", Trans. of the Institute of Electronics and Communication Engineers of Japan (A), vol. J–70A, pp. 903–910, 1987.

| i<br>j<br>k | i<br>0<br>0, ... , s0 | 1<br>0, ... , s1 | 2<br>0, ... , s2 | ... | i+1<br>0<br>0, ... |
|---|---|---|---|---|---|
| | $x^{s0},...,x,1$ | $yx^{s1},...,yx,y$ | $y^2 y^{s2},...,y^2x,y^2$ | ... | $x^{s0},...$ |

←     $f^{(i)}$     → ← $f^{(i+1)}$ ns an extension of
POLYNOMINAL-SET DERIVING APPARATUS AND METHOD

BACKGROUND OF THE INVENTION

1. Field of the Invention

This invention relates to error correction, in which in a digital communication system and a digital storage system, errors produced in a communication channel or a storage medium are corrected at the reception side using error correction codes. More particularly, the invention relates to a polynominal-set deriving apparatus and method, in which in a decoding operation using algebraic geometric codes as error correction codes, a set of minimal polynomials for generating a given multidimensional array corresponding to a syndrome in received words is obtained.

2. Description of the Related Art

RS (Reed-Solomon codes) codes and BCH (Bose-Chaudhuri-Hocquenghem) codes are well known as error correction codes for correcting errors produced in a communication channel or a storage medium at the reception side in a digital communication system and a digital storage system. These codes are actually used in apparatuses which deal with compact discs, satellite communication and the like.

Recently, however, codes named algebraic geometric codes utilizing the algebraic curve theory have been widely studied (see references (1)–(3)). Algebraic geometric codes belong to a code system which has a very wide applicational range, and which includes the above-described RS codes and BCH codes. It has gradually become clear that this system includes new codes having better properties than those of conventional codes (see reference (4)).

Decoding methods have always been a problem while such excellent codes have been discovered, and development of an efficient decoding algorithm has been requested. However, an efficient decoding algorithm has not been obtained at all until Justesen et al. have proposed a generalized Peterson algorithm (see reference (5)) in 1989. Justesen et al. have shown that by applying the Sakata algorithm (see reference (6)) proposed by Sakata to their generalized Peterson algorithm to provide an efficient algorithm for obtaining a two-dimensional linear feedback shift registers having a minimum number of storage elements, for generating a two-dimensional array having a given finite size, an error locator function can be derived at a high speed with a small amount of calculation.

However, since the generalized Peterson algorithm has a limitation in its correction capability, Skorobogatov et al. have proposed a Modified decoding algorithm (see reference (7)) which guarantees a higher correction capability.

Furthermore, since the Sakata algorithm includes a large amount of useless calculation not directly relating to the Modified decoding algorithm, Kamiya et al. have proposed an algorithm obtained by modifying the Sakata algorithm so as to conform to the Modified decoding algorithm in 1992 (see references (8) and (9)).

On the other hand, the Berlekamp-Massay algorithm (BM method) and the Euclidean algorithm (Eu method) are well known as conventional decoding methods for RS codes and BCH codes. The above-described generalized Peterson algorithm is an extension of the Peterson method used for decoding RS codes. The Sakata algorithm is also called a two-dimensional BM method, and is well known as an extension of the BM method used for decoding RS codes (hereinafter termed a one-dimensional BM method).

However, an algorithm corresponding to an extension of the Eu method used for decoding RS codes (hereinafter termed a one-dimensional EU method) has not previously been considered.

Although Sakata has also proposed a multidimensional BM method (see reference (10)) as an extension of the two-dimensional BM method, a multidimensional Eu method corresponding to that method has not been devised.

The multidimensional BM method is expressed by an algorithm having a structure as shown in FIG. 2 (see references (6) and (10) for a method of determining a defining point, rs, rt and the like).

Point n shown in FIG. 2 is updated by ordering termed a total order (see references (6) and (10)). In FIG. 2, the calculation of $df_n^{(i)}$ in step S22 and the updating of $f_n^{(i)}$ using h in step S25 are sequentially performed. This is because the calculation of $df_n^{(i)}$ in step S22 at point n is performed using h obtained in step S24 at point n−1, and the updating of $f_n^{(i)}$ using h in step S24 at point n is calculated using $df_n^{(i)}$ in step S22 at point n. In this case, as shown in FIG. 12, a useless time is produced in the processing time, and therefore such a method is not efficient.

On the other hand, a method has been proposed, in which the processes of steps S22 and S24 are executed in parallel utilizing that processing for one-dimensional variables in the one-dimensional BM method, which is a decoding method for RS codes and BCH codes, is sequentially performed (see reference (11)). However, since this method uses shift registers having a fixed number of stages, (t+1) (t is the maximum value of the defining point at the final point (n=p: see FIG. 2) of polynomial $f_n^{(i)}$) processing clock pulses are always required for a single updating operation (cycle) of $f_n^{(i)}$.

Accordingly, the apparatus of reference (9) requires useless processing clock pulses in the mid course of calculation (n<p) of $f_n^{(i)}$ which is not the largest defining point. Furthermore, the method of reference (9) does not consider the multidimensional BM method, and therefore is unsuitable for the multidimensional BM method in the following points:

1) Only one polynomial belongs to each of sets of polynomials F and G in the one-dimensional BM method, but a plurality of polynomials belong to each of sets of polynomials F and G in the multi-dimensional BM method.

2) In the one-dimensional BM method, since the degrees of polynomials which belong to sets of polynomials F and G and the arrangement of a given array are one dimensional (one variable), respective coefficients can be sequentially stored in a one-dimensional memory (a shift register or the like) from the highest degree. However, since the degrees of polynomials and the arrangement of the array in the multi-dimensional BM method are not one-dimensional, efficient processing cannot be performed with a one-dimensional memory.

3) In the one-dimensional BM method, since only one polynomial belongs to each of sets of polynomials F and G, parallel processing of polynomials is meaningless. In the multidimensional BM method, however, since a plurality of polynomials belong to each of sets of polynomials F and G, parallel processing of calculation of polynomials has a meaning.

4) In the one-dimensional BM method, since only one variable is present in a polynomial which belongs to each of sets of polynomials F and G, the processes of steps S22 and S23 cannot be performed in parallel if calculation for one variable is performed in parallel. In the multidimensional BM method, however, since a plurality of variables are present in a polynomial which belongs to each of sets of polynomials F and G, the processes of steps S22 and S24 can be performed in parallel if calculation for one variable is performed in parallel.

References (1) V. D. Goppa: "Codes on Algebraic Curves", Soviet Math. Dokl., 24, pp. 170–172, 1981.

(2) V. D. Goppa: "Algebraic-geometric Codes", Math. U.S.S.R. Izvestiya, vol. 21, No. 1, pp. 75–91, 1983.

(3) V. D. Goppa: "Geometry and Codes", Kluwer Academic Publishers, 1988.

(4) M. A. Tsfasman and S. G. Vladut: "Algebraic-geometric Codes", Kluwer Academic Publishers, 1991.

(5) J. Justesen, K. J. Larsen, E. Jensen, A. Havemose and T. Hoholdt: "Construction and Decoding of a Class of Algebraic Geometry Codes", IEEE Trans. Inform. Theory, vol. 35, No. 4, pp. 811–821, July, 1989.

(6) Sakata: "Synthesis of a Two-dimensional Linear Feedback Shift Register for Generating a Given Two-dimensional Array", Trans. of the Institute of Electronics and Communication Engineers of Japan (A), vol. J-70A, pp. 903–910, 1987.

(7) A. N. Skorobogatov and S. G. Vladut: "On the Decoding of Algebraic Geometric Codes", IEEE Trans. Inform. Theory, vol. 36, No. 5, pp. 1051–1060, September 1990.

(8) S. Sakata: "Extension of the Berlekamp-Massey Algorithm to N Dimensions", Information and Computation, vol. 84, pp. 207–239, 1990.

(9) Kamiya and Miura: "On the Application of the Sakata Algorithm for the Modified Decoding Algorithm Relating to Some Sort of Algebraic Curve Codes", Technical Report of the Institute of Electronics and Communication Engineers of Japan, vol. IT91, No. 435, IT91-96, pp. 47–54, 1992.

(10) Kamiya and Miura: "A Recurrent Decoding Algorithm Relating to Some Sort of Algebraic Curve Codes", Technical Report of the Institute of Electronics and Communication Engineers of Japan, vol. IT91, No. 505, IT91-116, pp. 89–96, 1992.

(11) Youzhi Xu: "Constrictions to the Decoding of Reed-Solomon and Related Codes" Linkoping Studies in Science and Technology. Dissertations No. 257, 1991.

SUMMARY OF THE INVENTION

It is an object of the present invention to shorten the overall processing time by executing a plurality of processing in parallel when deriving a set of minimal polynomials for generating a given multidimensional array.

It is another object of the present invention to provide a two-dimensional Eu method corresponding to an extension of the one-dimensional Eu method, and to provide a multidimensional Eu method corresponding to the multidimensional BM method by extending this two-dimensional Eu method.

It is still another object of the present invention to provide a method for efficiently performing parallel processing of a plurality of processes in the multidimensional BM method, and an apparatus for realizing the method.

According to one aspect, the present invention which achieves these objectives relates to a polynomial-set deriving apparatus for obtaining a set of minimal polynomials for generating a given multidimensional array, comprising first storage means for storing a first set of polynomials to be obtained, second storage means for storing a first set of auxiliary polynomial for the first set of polynomials, third storage means for storing a second set of polynomials different from the first set of polynomials, fourth storage means for storing a second set of auxiliary polynomials for the second set of polynomials, first discrimination means for discriminating if the coefficient of a predetermined degree of each polynomial of the second set of polynomials stored in the third storage means equals zero, determination means for newly determinating a defining point if a polynomial, in which the coefficient of a predetermined degree does not equal zero, is present as a result of the discrimination by the first discrimination means, first derivation means for deriving polynomials which belong to the second set of polynomials based on the value of the defining point determined by the determination means, the second set of polynomials stored in the third storage means, and the second set of auxiliary polynomials stored in the fourth storage means, first updating means for erasing all polynomials, in which the coefficient of a predetermined degree does not equal zero, from the third storage means, and for storing the polynomials derived by the first derivation means in the third storage means, second derivation means for deriving polynomials which belong to the first set of polynomials based on the value of the defining point determined by the determination means, the first set of polynomials stored in the first storage means, the first set of auxiliary polynomials stored in the second storage means, and the coefficient of a polynomial of the second set of polynomials relating to the determined defining point, second updating means for erasing all polynomials corresponding to the polynomials erased by the first updating means from the first storage means, and for storing the polynomials derived by the second derivation means in the first storage means, second discrimination means for discriminating the presence of a change of the defining point, third updating means for updating the first set of auxiliary polynomials stored in said second storage means based on the first set of auxiliary polynomials stored in the second storage means, and the polynomials erased by the second updating means, when the second discrimination means has discriminated the presence of a change in the defining point, and fourth updating means for updating the first set of auxiliary polynomials stored in the second storage means based on the second set of auxiliary polynomials stored in the fourth storage means, and the polynomials erased by the first updating means, when the second discrimination means has discriminated the presence of a change in the defining point.

According to another aspect, the present invention which achieves these objectives relates to a method for obtaining a set of minimal polynomials for generating a given multidimensional array, comprising the steps of setting initial values for a first memory for storing a first set of polynomials to be obtained, a second memory for storing a first set of auxiliary polynomials for the first set of polynomials, a third memory for storing a second set of polynomials different from the first set of polynomials, and a fourth memory for storing a second set of auxiliary polynomials for the second set of polynomials, discriminating if the coefficient of a predetermined degree of each polynomial of the second set of polynomials stored in the third memory equals zero, newly determining a defining point if a polynomial, in which the coefficient of a predetermined degree does not equal zero, is present as a result of the discrimination, deriving polynomials which belong to the second set of polynomials based on the value of the determined defining point, the second set of polynomials stored in the third memory, and the second set of auxiliary polynomials stored in the fourth memory, erasing all polynomials in which the coefficient of a predetermined degree does not equal zero, and updating the third memory by storing the polynomials derived by first derivation means, deriving polynomials which belong to the first set of polynomials based on the value of the determined defining point, the first set of polynomials stored in the first memory, the first set of auxiliary polynomials stored in the second memory, and the coefficient of a polynomial of the second set of polynomials relating to the determined defining point, erasing all polynomials corresponding to the polynomials erased by the updating operation of the third memory, and updating the first memory by storing the derived polynomials, discriminating the presence of a change of the defining point, updating the first set of auxiliary polynomials stored in the second memory based on the first set of auxiliary polynomials stored in the second memory, and the polynomials erased by the updating operation of the first memory, when it has been discriminated that the defining point has changed by the discrimination operation, and updating the first set of auxiliary polynomials stored in the second memory based on the second set of auxiliary polynomials stored in the fourth memory and the polynomials erased by the updating operation of the third memory, when it has been discriminated that the defining point has changed.

According to still another aspect, the present invention which achieves these objectives relates to a polynomial-set deriving apparatus for obtaining a set of minimal polynomials for generating a given multidimensional array, comprising array storage means for storing a given multidimensional array u, first polynomial storage means for storing a set of polynomials F to be obtained, second polynomial storage means for storing a set of auxiliary polynomials G for the set of polynomials F, first calculation means for obtaining polynomials $f^{(k)}$ which belong to the set of polynomials F based on polynomials $f^{(i)}$ stored in the first polynomial storage means, polynomials $g^{(j)}$ stored in the second polynomial storage means, and deviations of polynomials $df_n^{(i)}$, second calculation means for obtaining deviations of polynomials $df_{n+1}^{(k)}$ based on the coefficients of the polynomials $f^{(k)}$ calculated by the first calculation means and the multidimensional array u stored in the array storage means, and control means for controlling accessing operations for the first polynomial storage means and the second polynomial storage means and accessed addresses in parallel depending on the degrees of the polynomials $f^{(k)}$. The calculation by the first calculation means and the calculation by the second calculation means are executed in parallel.

According to yet another aspect, the present invention which achieves these objectives relates to a method for obtaining a set of minimal polynomials for generating a given multidimensional array, comprising the steps of storing a given multidimensional array u in an array memory, obtaining polynomials $f^{(k)}$ which belong to a set of polynomial F to be obtained, based on polynomials $f^{(i)}$ stored in a first polynomial memory for storing the set of polynomials F, polynomials $g^{(i)}$ stored in a second polynomial memory for storing a set of polynomials G different from the set of polynomials F, and deviations of polynomials $df_n^{(i)}$, obtaining deviations of polynomials $df_{n+1}^{(k)}$ based on the polynomials $f^{(k)}$ obtained by the first calculation operation and the multidimensional array u stored in the array memory, and controlling accessing operations for the first polynomial memory, the second polynomial memory, and accessed addresses in parallel depending on the degrees of the polynomials $f^{(k)}$, and executing the first and second calculation operations in parallel.

Other objectives and advantages besides those discussed above shall be apparent to those skilled in the art from the description of preferred embodiments of the invention which follows. In the description, reference is made to the accompanying drawings, which form a part thereof, and which illustrate examples of the invention. Such examples, however, are not exhaustive of various embodiments of the invention, and therefore reference is made to the claims which follow the description for determining the scope of the invention.

DESCRIPTION OF THE PREFERRED EMBODIMENTS

Figure 13:
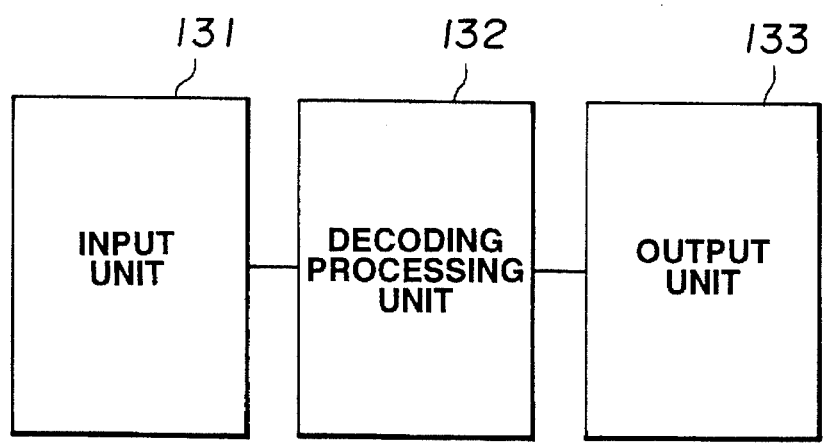
FIG. 13 is a diagram illustrating the configuration of an apparatus for decoding algebraic geometric codes.

FIG. 13 is a diagram illustrating the configuration of an apparatus for decoding algebraic geometric codes. In FIG. 13, input unit 131 includes a reception device for receiving data from satellite broadcast or a communication network, a reading circuit for reading data from a storage medium, such as a CD (compact disc) or the like, and the like, and inputs received words corresponding to image data or voice data. Decoding processing unit 132 decodes the received words input to input unit 131. Output unit 133 outputs decoded data, and includes a display for displaying image data, a speaker for outputting decoded voice data, and the like.

Figure 14:
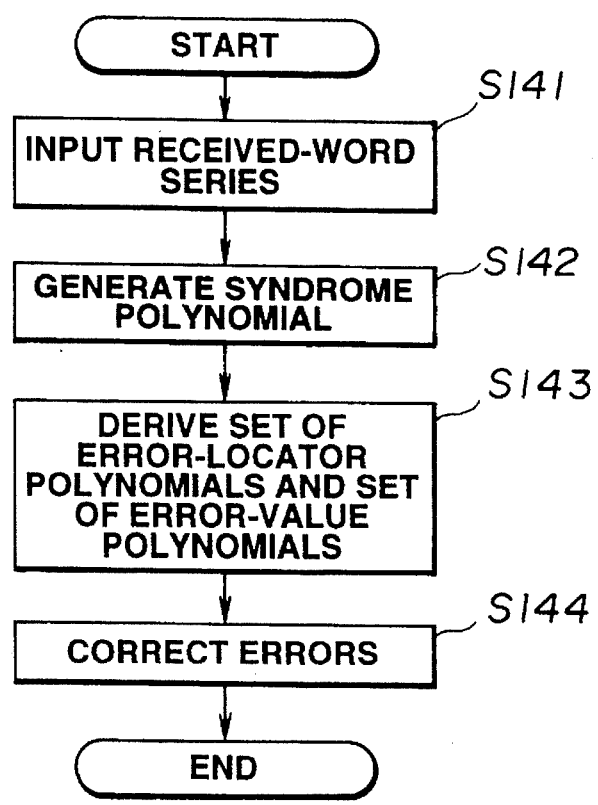
FIG. 14 is a flowchart illustrating a decoding procedure of the decoding processing unit shown in FIG. 13.

FIG. 14 is a flowchart illustrating a decoding procedure of decoding processing unit 132. In the present embodiment, as in the case of decoding RS codes, decoding of algebraic geometric codes is performed by the following procedure when erasure correction is not included. First, in step S141, a received-word series having a predetermined size, serving as a unit of decoding, is input. In step S142, a syndrome polynomial u(z) is generated from the received-word series. In this step, a multidimensional array u corresponding to the coefficients of the polynomial is generated. In step S143, a set of error locator polynominals F and a set of error value polynomials B are derived from the multidimensional array u. In step S144, an error is corrected at the position of the error in the received words obtained from the set of error locator polynomials F based on the value or the error obtained from the set of error value polynomials B.

A method and apparatus for deriving the set of error locator polynomials F and the set of error value polynomials B from the multidimensional array u will now be described.

For that purpose, a two-dimensional Eu method corresponding to an extension of the one-dimensional Eu method will be proposed.

It will be shown that the two-dimensional Eu method outputs results equivalent to those of the Sakata algorithm, which is the two-dimensional BM method, and the Kamiya algorithm, which is a modified algorithm of the Sakata algorithm. Furthermore, a multidimensional Eu method corresponding to the multidimensional BM method will be proposed by extending the two-dimensional Eu method.

It will also be shown that the multidimensional Eu method of the present invention is an algorithm which has effects different from those of the conventional multidimensional BM method in providing an apparatus and high speed, and differences between the two methods will be described.

Figure 2:
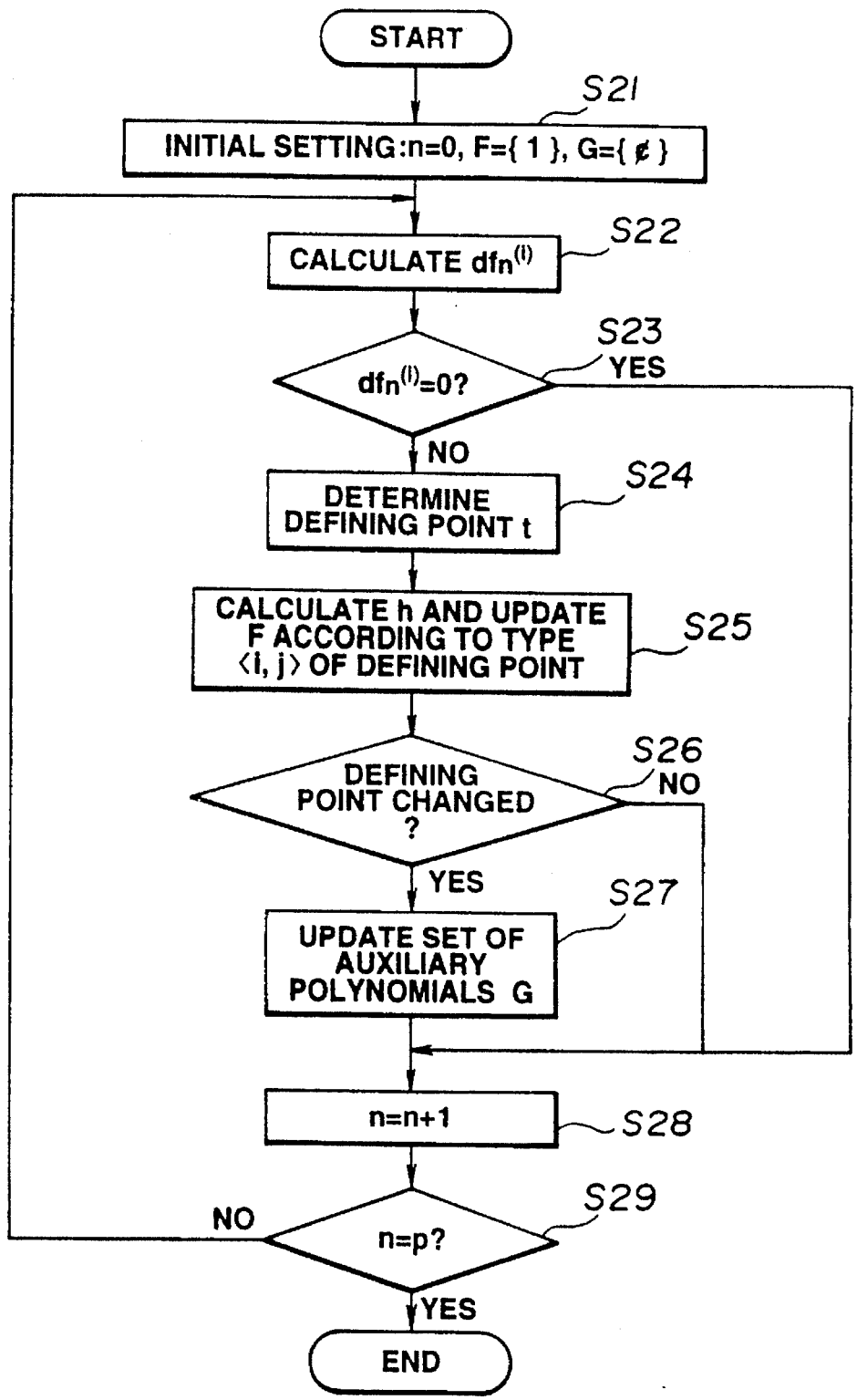
FIG. 2 is a multidimensional-array generation algorithm according to a conventional BM method.

The known conventional algorithm of the multidimensional BM method has the structure shown in FIG. 2. On the other hand, the algorithm of the multidimensional Eu method of the present invention has the structure shown in FIG. 3. The multidimensional BM method differs from the multidimensional Eu method in that in the multidimensional BM method, $df_n^{(i)}$ are directly calculated in step S22, and the set of polynomials F is updated using the calculated values in step S25, while in the multidimensional Eu method, $df_n^{(i)}$ are not directly calculated, and the set of polynomials B is updated in step S34 and the set of polynomials F is updated in step S35 using the highest-degree coefficient $d_i$ of polynomials which belong to the newly introduced set of polynomials B.

Figure 3:
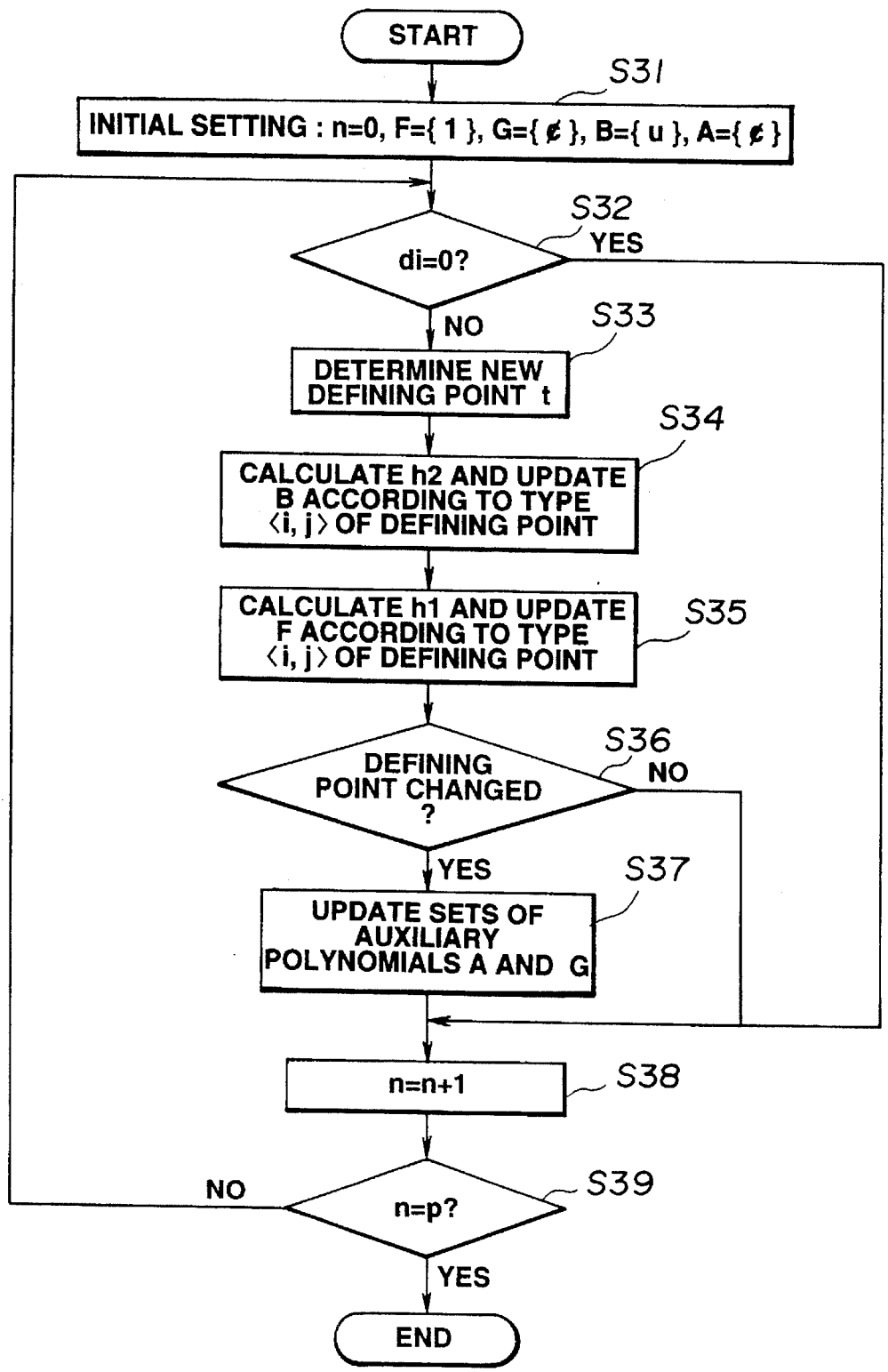
FIG. 3 is a multidimensional-array generation algorithm according to the Eu method of the present invention.

The above-described references (8) and (13) have proved that the above-described conventional multidimensional BM method derives a set of minimal polynomials F for generating a given multidimensional array u. Accordingly, by proving that the multidimensional Eu method of the present invention derives the same set of polynomials F as that of the multidimensional BM method by the following theorems 1 through 3, it will be shown that the set of polynomials F obtained by the multidimensional Eu method shown in FIG. 3 is also a set of minimal polynomials for generating a given multidimensional array u. The multidimensional Eu method of the present invention will now be more specifically described illustrating the known conventional two-dimensional BM method and multidimensional BM method.

First Embodiment

First, the Sakata algorithm will be shown after the following preparation (explanation of terms). Since the proof that this algorithm derives a set of polynomials F for synthesizing a two-dimensional linear shift register having a minimum number of storage elements for generating a given finite two-dimensional array u has been made in the above-described reference (8), an explanation of the proof will be omitted.

Preparation 1 (for details, see reference (8))

$\Sigma$: A set of pairs $n=(n1, n2)$ of all non-negative integers n1 and n2.

n: This notation is called a point, which is identified with a point having coordinates (n1, n2) on the X-Y plane.

$<_T$: This notation is called a total order, and determines the magnitude relationship of point n on set $\Sigma$. The point next to point $n=(n1, n2)$ with respect to $<_T$ is defined in the following manner:

$$n + 1 \quad : \quad = (n1 - 1, n2 + 1) \quad \text{(when } n1 > 0\text{)}$$
$$\quad : \quad (n2 + 1, 0) \quad \text{(when } n1 = 0\text{)}.$$

$<_p$: This notation is called a partial order, which is defined as follows:
  $m \leq_p n$ when and only when $m1 \leq n1$, $m2 \leq n2$, where $m=(m1, m2)$ and $n=(n1, n2)$.
  $m <_p n$ indicates that $m \leq_p n$ and $m \neq n$.

$\Sigma_t^P := \{m \in \Sigma | t \leq_p m, m <_T p\}$.

u: u is a finite partial two-dimensional array having a size q, and is defined as a mapping onto field K from $\Sigma_0^q$.

F: Bivariate polynomials on field K are expressed by $$f = \sum_{m \in \Gamma f} fm \cdot z^m.$$

and
$z^m = x^{m1} \cdot y^{m2}$, $\Gamma f = \{m \in \Sigma | f_m \neq 0\}$
$s = LP(f) = \max \{m | m \in \Gamma f\}$.

A set of polynomials is expressed by:

$$F = \{f^{(0)}, \ldots, f^{(1-1)}\}.$$

$df_n^{(i)}$: If the mapping from point n on set $\Sigma$ onto field K is represented by un, $$df_n^{(i)} = \sum_{m \in \Gamma f} fm^{(i)} \cdot um + n - s$$

s for polynomials $f^{(i)}$ satisfying $LP(f^{(i)}) = s^{(i)}$.

V(u): If the set of un for $p \leq_T q$ is expressed by:
$u^p = \{un \ n \in \Sigma_0^P\}$, and if $df_n^{(i)} = 0$ $(0 \leq n < p)$ for $u^P$, $f[up] = 0$.
At that time, it is assumed that:

$$V(up) = \{f(\text{polynomial}) | f[u^p] = 0\}.$$

Defining point: When the set of polynomials F is a set of minimal polynomials which can generate a given two-dimensional array, $LP(f^{(i)}) = s^{(i)}$ is termed a defining point. A set of minimal polynomials satisfies the following conditions:

i) $F \subseteq V(u^P)$ ii) i and j satisfying conditions that $1 \leq i$, $j \leq 1$, $i \neq j$, and $LP(f^{(i)}) \geq_p LP(f^{(j)})$ are not present.

iii) A polynomial g satisfying conditions that $g \in V(u)$ and $LP(g) \in \Delta F$ is not present, where $$\Delta F = \Sigma / U \sum_{k=1} s(k), \text{ and } \Sigma s(k) = \{m \in \Sigma | s(k) \leq pm\}.$$

$\Delta$: This symbol indicates $\Delta F$ when the above-described conditions are satisfied, and is obtained in the following manner:
  $\Delta = U \Delta^{q-s}$
  $q, s \in \Sigma_0^P$,
  and $\Delta^{q-s} = \{m \in \Sigma | m \leq_p q-s\}$ when $f \in V(u^q)$ satisfying conditions that $df_q \neq 0$, and $LP(f) = s$ is present.
  $\Delta^{q-s} = \phi$ in other conditions.

h1: h1 of type $<i, j>$ is defined as follows:

$$h1 = z^{r-s(i)} \cdot f^{(i)} - (d_i/d_j) \cdot z^{r-n+m-1(j)} \cdot g(j),$$

where
r=(r1, r2),
r1=max{s1$^{(i)}$, n1−s1$^{(j)}$+1},
r2=max{s2$^{(i)}$, n2−s2$^{(j+1)}$+1}, t$^{(j)}$=LP(g$^{(j)}$),
f$^{(i)}$∈V(u$^n$), g$^{(j)}$∈V(u$^m$), d$_f$=df$_n$$^{(i)}$, and
d$_j$=dg$_m$$^{(j)}$.

G: This notation is called a set of auxiliary polynomials of F, and is a set of polynomials $$G=\{g^{(0)}, \ldots, g^{(l-2)}\}.$$

Lemma 1: j of the type determined by ① is j satisfying the condition of LP(f$^{(j)}$)=s$^{(j)}$, and $$p-s^{(i)} \leq_p (s1^{(j)}-1, s2^{(j+1)}-1).$$

Lemma 2: k of the type determined by ② is k satisfying the condition of LP(f$^{(k)}$)<$_p$ t.

Sakata Algorithm
1) n=(0, 0), F={1}, and G=$_ε$.
2) Calculate df$_n$$^{(i)}$ for all polynomials of F.
3) If f$^{(i)}$ satisfying df$_n$$^{(i)}$≠0 is present, a new Δ and a new defining point t are determined.
4) The following procedure is executed for all defining points t:
   ① t=(s1$^{(i)}$, s2$^{(i)}$)→Provide polynomial h1 of lemma 1.
   ② t=(n1−s1$^{(i)}$+1, n2→s2$^{(i+1)}$+1)→Provide h1 of type <k, i> of lemma 2.
   ③ t=(n1−s1$^{(i)}$+1, s2$^{(j)}$), 1≦i≦l−1,→Provide h1 of type <j, i>.
   ④ t=(s1$^{(i)}$, n2−s2$^{(j)}$+1), 2≦j≦l→Provide h1 of type <i, j−1>.
   ⑤ t=(n1+1, s2$^{(j)}$)→h1=x$^{n1-s1(j)+1}$·f$^{(j)}$
   ⑥ t=(s1$^{(i)}$, n2+1)→h1=y$^{n2-s2(i)+1}$·f$^{(i)}$.

All polynomials satisfying the condition df$_n$$^{(i)}$≠0 are removed from F, and all newly obtained h1 are inserted in F.

5) When Δ has changed, polynomials of set of auxiliary polynomials G for the new F are selected from polynomials of the old G and the polynomials removed from F.
6) The process is terminated if n=n+1; n=p. The process proceeds to 2) in other cases.

A new algorithm according to the present invention which derives the same output as the Sakata algorithm will now be described.

Algorithm 1
1) n=(0, 0), F={1}, G=$_ε$, A={x−1}, and B={u}.
2) If the highest-degree coefficient of all polynomials of B does not equal zero, a new Δ and a new defining point t are determined.
3) The following procedure is performed for all the defining points t.
   ① t=(s1$^{(i)}$, s2$^{(i)}$)→Provide polynomial h2 having the type of lemma 1.
   ② t=(n1−s1$^{(i)}$+1, n2−s2$^{(i+1)}$+1)→Provide h2 of type <k, i> of lemma 2.
   ③ t=(n1−s1$^{(i)}$+1, s2$^{(j)}$), 1≦i≦l−1→Provide h2 of type <j, i>.
   ④ t=(s1$^{(i)}$, n2−s2$^{(j)}$+1), 2≦j≦l→Provide h2 of type <i, j−1>.
   ⑤ t=(n1+1, s2$^{(j)}$)→h2=x$^{-(n1-s1(j)+1)}$·b$^{(j)}$.
   ⑥ t=(s1$^{(i)}$, n2+1)→h2=y$^{n2-s2(i)+1}$·b$^{(i)}$.

All polynomials in which the highest-order coefficient does not equal zero are removed from B, and all newly obtained h2 are inserted in B.

4) Polynomial h1 of the type determined in 3) is provided. Polynomials corresponding to the polynomials removed from B are removed from F, and newly obtained hi is inserted in F.

5) When Δ has changed, polynomials of set of auxiliary polynomials G for the new F are selected from polynomials of the old G and the polynomials removed from F. Polynomials of set of auxiliary polynomials A for the new B are selected from polynomials of the old G and the polynomials removed from B.

6) The process is terminated if n=n+1; n=p. The process proceeds to 2) in other conditions, where A and B are sets of polynomials such that A={a$^{(o)}$, ..., a$^{(l-2)}$} and B={b$^{(0)}$, ..., b$^{(l-1)}$}.

h2: h2 of type <i, j> is defined as follows:

$$h2=z^{r-s(i)}\cdot b(i)-(d_f/d_j)\cdot z^{r-n+m-t(j)}\cdot a(j).$$

A large difference between the algorithm 1 and the Sakata algorithm is that in the Sakata algorithm, df$_n$$^{(i)}$ are directly calculated and it is checked if all of them equal zero, while in the algorithm 1, df$_n$$^{(i)}$ are not directly calculated but it is checked if the highest-degree coefficient of polynomials b$^{(i)}$ which belong to B equals zero. For that purpose, the algorithm 1 introduces sets A and B of polynomials which are not present in the Sakata algorithm.

The fact that set F obtained by the algorithm 1 is the same set as set F obtained by the Sakata algorithm can be proved in the following manner:

Theorem 1

If a polynomial obtained by multiplying polynomial u having the coefficient un (n∈Σ0p) defined by expression (1) by polynomial f in which LP(f)=s is represented by b, the z$^{v-n+s}$-degree coefficient bv−n+s of polynomial b is expressed by the following expression (2):

$$u=\Sigma un \cdot zv-n \quad (1)$$

$$n \in \Sigma_0^p$$

$$bv-n+s=\Sigma fm \cdot um+n-s \quad (2)$$

$$m \in \Gamma f,$$

where v is an arbitrary integer.

Proof:

$$f \cdot u = \Sigma_m \Sigma_i fm \cdot ui \cdot zv-i+m \text{ from expression (1).}$$

Hence, the coefficient bv−n+s of z$^{v-n+s}$ of polynomial b becomes as shown in expression (2), because i=m+n−s from v−i+m=v−n+s.
(Proof completed)

From this theorem, it can be understood that the coefficient of z$^{v-n+s}$ of b(i)=f$^{(i)}$·u corresponding to f(i)∈F equals df$_n$$^{(i)}$ of the Sakata algorithm.

If polynomial f$^{(i)}$ which is V(u$^n$) is represented by f$_n$$^{(i)}$, the following theorem holds:

Theorem 2

If polynomials updated by expressions (3) and (4) are represented by l$_q$$^{(k)}$ and c$_q$$^{(k)}$ (q>$_T$ n>$_T$ m), and polynomial w$_q$$^{(k)}$ is defined by expression (5), w$_q$$^{(k)}$ can be updated by expression (6):

$$l_q^{(k)}=z^{rs}\cdot l_n^{(i)}-(d_f/d_j)\cdot z^{rt}\cdot l_m^{(j)} \quad (3)$$

$$c_q^{(k)}=z^{rs}\cdot c_n^{(i)}-(d_f/d_j)\cdot z^{rt}\cdot c_m^{(j)} \quad (4)$$

$$w_q^{(k)}=l_q^{(k)}\cdot e-c_q^{(k)}\cdot d \text{ (d and e are arbitrary polynomials)} \quad (5)$$

$$w_q^{(k)}=z^{rs}\cdot w_n^{(i)}-(d_f/d_j)\cdot z^{rt}\cdot w_m^{(j)} \quad (6),$$

where rs and rt are arbitrary integers, and the initial values of l$_n$$^{(i)}$, l$_m$$^{(j)}$, c$_n$$^{(i)}$ and c$_m$$^{(j)}$ are arbitrary polynomials.

Proof:

Since expression (6) holds for arbitrary q and k, the following expressions hold:

$$w_n^{(i)} = l_n^{(i)} \cdot e - c_n^{(i)} \cdot d$$

$$w_m^{(j)} = l_m^{(j)} \cdot e - c_m^{(j)} \cdot d.$$

Accordingly, the following expression holds:

$$\begin{aligned} w_q(k) &= l_q^{(k)} \cdot e - c_n^{(i)} \cdot d \\ &= (z^{rs} \cdot \ln^{(i)} - (d_i/d_j) \cdot z^{rt} \cdot lm^{(j)}) \cdot e - \\ & \quad (z^{rs} \cdot cn(j) - (d_i/d_j) \cdot z^{rt} \cdot c_m^{(j)}) \cdot d \\ &= z^{rs} \cdot w_n^{(i)} - (d_i/d_j) \cdot z^{rt} \cdot w_m^{(j)}. \end{aligned}$$

(Proof completed)

In the Sakata algorithm, $f^{(k)} = f_q^{(k)} \in F$ which becomes $V(u^q)$ is updated by h1, and $g^{(j)}$ equals $f^{(j)} = f_m^{(j)}$ which becomes $V(u^m)$. Hence, h1 can be expressed in the form of expression (3).

The following theorem also holds:

Theorem 3

If $l_q^{(k)} = f_q^{(k)}$, $e = u$, $d = z^v \cdot x$, $c_{-1}^{(j)} = 1$, and $c_0^{(i)} = 0$ in expression (5), $w_q^{(k)} = b_q^{(k)}$ at deg $w_q^{(k)} \leq V$. At that time, $b_q^{(k)}$ is the $(v - q + s^{(k)})$-degree polynomial.

Proof:

Since $l_q^{(k)} = f_q^{(k)}$ and $e = u$, expression (5) becomes $w_q^{(k)} = b_q^{(k)} - c_q^{(k)} \cdot d$. If deg $c_{-1}^{(j)} \leq 0$ and deg $c_0^{(i)} \leq 0$, $c_q^{(k)}$ is a positive-degree polynomial from expression (4), and $d = z^v \cdot x$, and therefore deg $c_q^{(k)} \cdot d > v$. Hence, if deg $w_q^{(k)} \leq v$, $w_q^{(k)} = b_q^{(k)}$.

From the definition, the highest degree of $b_q^{(k)} = u \cdot f_q^{(k)}$ is $v + s^{(k)}$. Since $f_q^{(k)}$ at that time is $f_q^{(k)} \in V(uq)$, $df_i^{(k)} = 0$ ($i = 0, \ldots, q-1$). From theorem 1, $df_i^{(k)}$ is the coefficient of $z^{v-i+s(k)}$. Hence, the $(v - i + s^{(k)})$-degree ($i = 0, \ldots, q-1$) coefficient of $b_q^{(k)}$ becomes 0, and the highest degree of $b_q^{(k)}$ becomes $v - q + s^{(k)}$.

(Proof completed)

Accordingly, $b_q^{(k)} = w_q^{(k)}$ can be updated by expression (6). That is, $b_q^{(k)}$ can be updated by h2. In this case, from theorem 1 and theorem 3, $d_i$ and $d_j$ are the coefficients of $z^{v-n+s(i)}$ and $z^{v-m+s(j)}$ of polynomials $b_n^{(i)}$ and $b_m^{(j)}$, respectively, that is, the highest-degree coefficients.

As described above, it was proved that F obtained by the algorithm 1 is the same set of polynomials as F obtained by the Sakata algorithm. Since it has been proved in reference (8) that the set of polynomials F obtained by the Sakata algorithm is a set of minimal polynomials for generating a given two-dimensional array u, it can be said that the set of polynomials F obtained from the algorithm 1 is also a set of minimal polynomials for generating a given two-dimensional array u.

Figure 1:
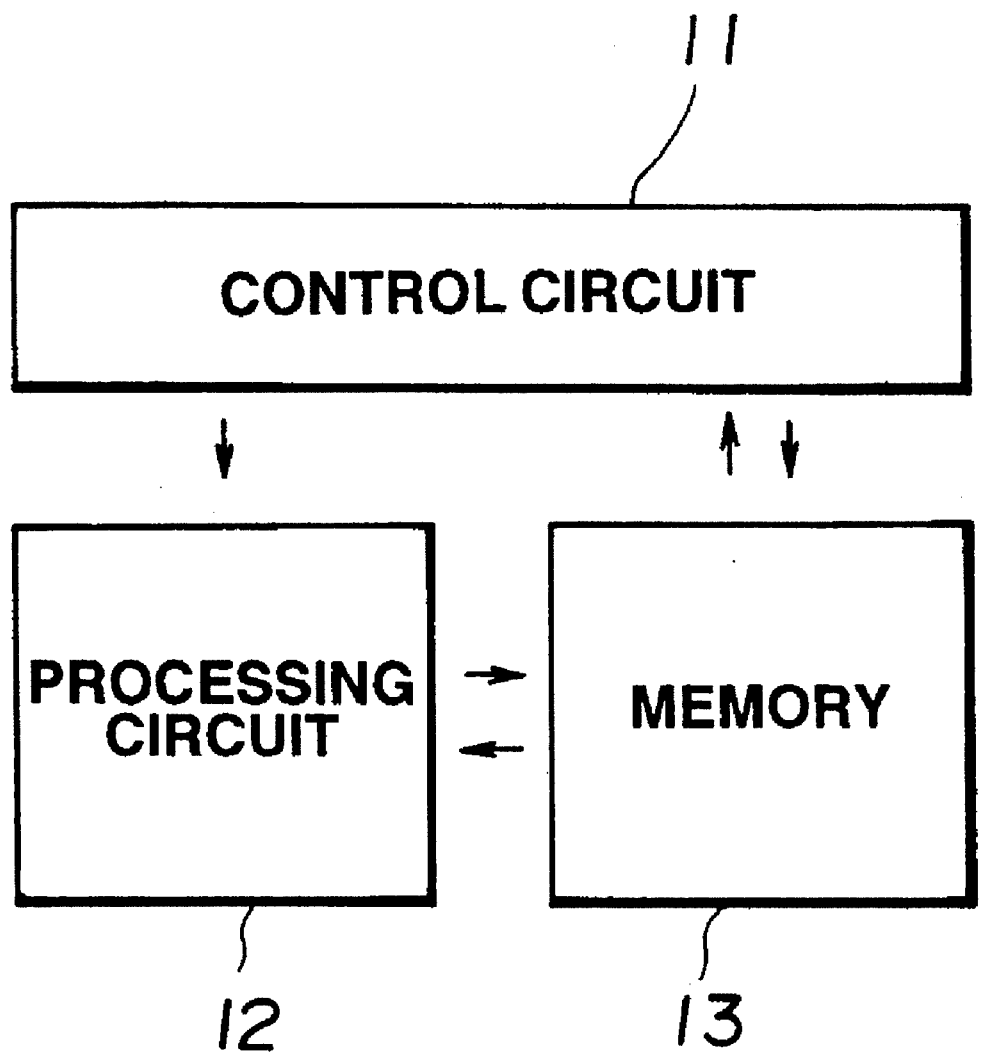
FIG. 1 is a multidimensional-array generation circuit according to the present invention.

Accordingly, this algorithm can be realized, for example, by the apparatus shown in FIG. 1. First, it is determined if the highest-degree coefficient of polynomials B stored in memory 13 for storing the initial values and the updated values set in item 1) of algorithm 1 equals 0. If the result of the determination is affirmative, item 6) is executed. If the result of the determination is negative, control circuit 11 executes item 2) for calculating a new defining point and determining the type, and processing circuit 12 performs the calculation of h2 and h1 shown in items 3) and 4), respectively, in accordance with the type. If the defining point has been updated, control circuit 11 newly selects and updates polynomials of A and G within memory 13 as shown in item 5).

Control circuit 11 and processing circuit 12 need not be separated, since the above-described processing may be executed by a software approach by causing the CPU to execute programs corresponding to the respective control procedures and the above-described algorithm. Since the calculation necessary for the above-described control and processing comprises multiplication, division, addition and subtraction of simple integers, no particular circuit and processing are required. The above-described operations may be simplified if the determination of the type and the flow of the procedure in the control are previously programmed or printed in a ROM (read-only memory) and are retrieved (by looking up a table) whenever necessary.

Since h1 and h2 can be simultaneously processed, independent processing circuits may be provided for h1 and h2. Furthermore, since h1 and h2 are processed in the same manner, h1 an h2 may be processed by a single circuit. As will be described later with respect to the effects of the invention, one of the characteristics of this algorithm is easiness of performing parallel processing, a plurality of processing circuits may be provided. As described above, the circuitry for executing the algorithm 1 can be easily realized.

Second Embodiment

Next, an algorithm equivalent to the algorithm suitable for the Modified decoding algorithm presented by Kamiya et al. will be considered. First, after the following preparation, the algorithm presented by Kamiya et al. will be shown. Items which are not described in the following preparation are the same as in the first embodiment.

Preparation 2 (for details, see reference (12))

$<_T$: In the present embodiment, the total order is defined as follows:

$Q(i) = a \cdot i1 + b \cdot i2$ (a and b are natural numbers which are mutually prime, $i = (i1, i2)$))

$m \leq_T n$, if $Q(m) < Q(n)$ is satisfied, or only when $Q(m) = Q(n)$ and $m2 \leq n2$, and the point next to point m is represented by $m + 1$ with respect to this total order $<_T$.

$$\Sigma_t^P(n) := \{m \in \Sigma | m2 \leq n, \ t \leq_p m, \ m <_T p\}$$

u: u is a finite partial two-dimensional array having a size q, and is defined as a mapping from $\Sigma_0^q(2 \cdot (a-1))$ onto field K.

F: Bivariate polynomials on field K are expressed by $$f = \Sigma fm \cdot z^m$$

$m \in \Gamma f$, where $$z^m = x^{m1} \cdot y^{m2}, \ \Gamma f = \{m \in \Gamma(a-1) | fm \neq 0\}$$

$$s = LP(f) = \max\{m | m \in \Gamma f\}$$

A set of polynomials is expressed by $$f = \{f^{(0)}, \ldots, f^{(a-1)}\}.$$

V(u): If the set of un for $Q(p) < q$ is represented by $\{un | n \in \Sigma_0^P(2 \cdot (a-1))\}$, and if $df_n^{(i)} = 0$ ($n \in \Sigma_s^P(a - 1 + s2)$) for $u^p$, $f[u^p] = 0$. At that time, $V(u^p) = \{f \text{ (a polynomial)} | f[up] = 0\}$.

Δ: Δ is obtained in the following manner:

$$\Delta = U\Delta^{q-s}$$

$q, s \in \Sigma_0^P(2 \cdot (a-1))$, where $\Delta^{q-s} = \{m \in \Sigma(a-1) | m1 \leq q1-s1, m2=q2-s2\}$ when f $V(u^q)$ satisfying $df_q \neq 0$ and $LP(f)=s$ is present, and $\Delta^{q-s} = \phi$ in other cases.

h3: h3 of type <i, j> is defined as follows:

$$h3 = x^{r1-s1(i)} \cdot f^{(i)} - (d_i/d_j) \cdot x^{r1-1+m1-t1(j)} \cdot g^{(j)}$$

G: This notation is called a set of auxiliary polynomials of F, and is a set-of polynomials:

$$G = \{g^{(0)}, \ldots, g^{(a-1)}\}$$

Kamiya algorithm

1) $n=(0, 0)$, $F=\{1, y, y^2, \ldots, y^{a-1}\}$, $G=\phi$.
2) Calculate $df_n^{(i)}$ of all polynomials of F.
3) If $f^{(i)}$ satisfying $df_n^{(i)} \neq 0$ is present, a new $\Delta$ and a new defining point t are determined.
4) The following procedure is executed for all defining points t:
   $t=(s1^{(i)}, s2^{(i)}) \rightarrow$ Provide h3 of type <i, n2−i>.
   $t=(n1-s1^{(i)}+1, n2-s2^{(i)}) \rightarrow$ Provide h3 of type <n2−i, i>.
   $t=(n1+1, n2-s2^{(i)}) \rightarrow$
   $h3 = x^{n1-s1(n2-i)+1} \cdot f^{(n2-i)}$.

All polynomials satisfying $df_n^{(i)} \neq 0$ are removed from F, and all newly obtained h3 are inserted in F.
5) When $\Delta$ has changed, polynomials of set of auxiliary polynomials G for the new F are selected from polynomials of the old G and removed polynomials of F.
6) The process is terminated if $n=n+1$; $n=p$. The process proceeds to item 2) in other cases.

An algorithm equivalent to the Kamiya algorithm will now be shown.

Algorithm 2

1) $n=(0, 0)$, $F=\{1, y, \ldots, y^{-1}\}$, $G=\phi$, $A=\{\phi\}$, $B=\{u\}$.
2) If the highest-degree coefficients of all polynomials of B does not equal 0, a new $\Delta$ and a new defining point t are determined.
3) The following procedure is executed at all the defining points t.
   ① $t=(s1^{(i)}, s2^{(i)}) \rightarrow$ Provide h4 of type (i, n2−i>.
   ② $t+(n1-s1^{(i)}+1, n2-s2^{(i)}) \rightarrow$ Provide h4 of type <n2−i, i>.
   ③ $t=(n1+1, n2-s2^{(i)}) \rightarrow$ $$h4 = x^{r1(n2-i)-n1-1} \cdot f^{(n2-i)}.$$

All polynomials in which the highest-degree coefficient does not equal 0 are removed from B, and all of newly obtained h4 are inserted in B.
4) Polynomial h3 of the type determined in item 3) is provided. Polynomials corresponding to the polynomials removed from B are removed from F, and newly obtained h3 is inserted in F.
5) When $\Delta$ has changed, polynomials of set of auxiliary polynomials G for the new F are selected from polynomials of the old G and the polynomials removed from F. Polynomials of set of auxiliary polynomials A for the new B are selected from polynomials of the old A and the polynomials removed from B.
6) The process is terminated if $n=n+1$; $n=p$. The process proceeds to step 2) in other cases.

h4: h4 of type <i, j> is defined as follows:

$$h4 = x^{r1-s1(i)} \cdot b^{(i)} - (d_i/d_j) \cdot x^{r1-n1+m1-t1(j)} \cdot a^{(j)}.$$

As in the case of the algorithm 1 and the Sakata algorithm, differences between the algorithm 2 and the Kamiya algorithm are in that whether $df_n^{(i)}$ is directly calculated or the highest-order coefficient of polynomial b(i) which belongs to B is made to be $df_n^{(i)}$. Accordingly, if the relationship held between the algorithm 1 and the Sakata algorithm holds between the algorithm 2 and the Kamiya algorithm, it can be proved that the F obtained by the algorithm 2 is the same set of polynomials as the F obtained by the Kamiya algorithm in the following manner.

If it is assumed that $f^{(i)} \in F$ of theorem 1 is $f^{(i)}$ of the Kamiya algorithm, it can be said that the coefficient of $z^{v-n+s}$ of the corresponding polynomial $b^{(i)} = f^{(i)} 19$ u equals $df_n^{(i)}$ of the Kamiya algorithm. Hence, theorem 1 also holds in this embodiment.

Theorem 2 holds generally.

Since $f_q^{(k)}$ of theorem 3 equals $f^{(i)}$ of the Kamiya algorithm, theorem 3 also holds.

Accordingly, as in the case of the Sakata algorithm, since it can be said that $w_q^{(k)} = b_q^{(k)}$, $b_q^{(k)}$ can be updated by h4. Also in this case, from theorem 1, $d_i$ and $d_j$ are the highest-degree coefficients of the polynomials $b_n^{(i)}$ and $b_m^{(k)}$, respectively.

As described above, it has been proved that the F obtained by the algorithm 2 is the same set of polynomials as the F obtained by the Kamiya algorithm.

Accordingly, the algorithm 2 can also be realized by the apparatus shown in FIG. 1. However, the control and the processing are different from those of the algorithm 1. (In the processing, h3 and h4 are calculated. In the control, the determination of the type is simplified. In memory the polynomials shown in item 1) are stored in memory 13 as initial values for the A, B, F and G.) Since the algorithm 2 is also suitable for parallel processing, a plurality of processing circuits may be used. As described above, it can be understood that the circuitry for executing the algorithm 2 is easily realized.

Third Embodiment

Sakata et al. (see reference (13)) also show an algorithm for deriving a set of polynomials F for synthesizing a multidimensional shift register having a minimum number of storage elements for generating a multidimensional array. This algorithm is called a multidimensional BM method. In this embodiment, a new algorithm corresponding to the multidimensional BM method will be considered.

Since the detailed algorithm is complicated, characteristics of the algorithm called the BM method will be shown in a diagram. The algorithm proposed by Sakata (the multidimensional BM method), which is an extension of the one-dimensional BM method, including the one-dimensional BM method, has the structure shown in FIG. 2. An algorithm corresponding to this algorithm is shown in FIG. 3. As in the above-described two embodiments, differences between the methods shown in FIGS. 2 and 3 are in that whether $df_n^{(i)}$ is directly calculated, or the highest-degree coefficient of polynomial $b^{(i)}$ which belongs to B is made to be $df_n^{(i)}$. Accordingly, if theorems 1 through 3 hold also in the multidimensional array, it can be proved that the F obtained by the multidimensional BM method shown in FIG. 2 is the same set of polynomials as the F obtained by the algorithm shown in FIG. 3.

In the above-described embodiments, points are defined on the two-dimensional space in which $n=(n1, n2)$, and each coefficient of the array and the polynomial is a mapping at that point. When this concept is extended to the N-dimensional space, points are defined as $n=(n1, n2, \ldots, nN)$, and each coefficient of the array and the polynomial is a mapping at that point. Such relationship is identical irrespective of dimension. Hence, it is apparent that theorems 1 through 3 also hold in the N-dimensional space.

Accordingly, it can be said that the F generated from the algorithm shown in FIG. 3 is the same as the F generated from the algorithm shown in FIG. 2. Hence, the algorithm shown in FIG. 3 can be easily realized by the apparatus shown in FIG.

However, in the case of one dimension, the algorithm shown in FIG. 3 becomes the above-described algorithm called the Eu method used in decoding RS codes and BCH codes. As will be described in the effects of the invention, the algorithm shown in FIG. 3 extends the Eu method to multiple dimensions without losing the characteristics of the one-dimensional Eu method. Accordingly, the algorithm having the configuration of FIG. 3 including the algorithms 1 and 2 is termed a multidimensional Eu method which corresponds to the multidimensional BM method.

As described above, since the one-dimensional BM method and the one-dimensional Eu method are frequently used for RS codes and BCH codes, various kinds of modified algorithms have been proposed. A continued fraction method (see L. R. Welch and R. A. Scholtz: "Continued Fractions and Berlekamp's Algorithm", IEEE Trans. Inf. Theory, IT-25, pp. 19–27, January 1979) is a well-known modified algorithm of the one-dimensional Eu method. In this method, the calculation of expression (6) is not performed to the end, and calculation not relating to the final result is omitted. However, since this method is the same as the one-dimensional Eu method in that B is updated by the calculation of expression (6) and $df_n^{(i)}$ is not directly calculated, it is apparent that this method is also effective for various kinds of modified algorithms including the continued fraction method.

As can be understood from the cases of the algorithms 1 and 2, this method does not depend on the method of classifying types. Accordingly, this method is also entirely effective for a method in which $df_n^{(i)}$ is not directly calculated for the multidimensional array, as in the BM method, B is updated by the calculation of expression (6), and $df_n^{(i)}$ is calculated as the highest-degree coefficient of polynomials of B.

Although points and respective parameters (rs, rt and the like) are assumed to be integers, and $f_n^{(i)}$ and $b_n^{(i)}$ are assumed to be polynomials, it is apparent that this method is effective even if points and respective parameters are extended to arbitrary complex numbers, and polynomials are extended to rational functions and the like.

If the degrees of polynomials u and f are inverted (dual polynomials), the degree of polynomial $b=f \cdot u$ is also inverted, and $d_i$ can be the lowest-degree coefficient of polynomial b.

In theorem 3, it is assumed that $d=z^v \cdot x$. However, even if $d=z^{v+1}$ or $d=0$, $w_q^{(k)}=b_q^{(k)}$, and it is apparent that the result of the algorithm having the structure of FIG. 3 does not change.

Although in the above-described embodiment, the calculation shown in the following expression (7) is used for updating B the same result can be obtained by using the calculation shown in expression (8) except differences in constant terms.

$$b_{n+1}^{(k)} = z^{rs} \cdot b_n^{(i)} - (d_i/d_j) \cdot z^{rt} \cdot a_n^{(j)} \quad (7)$$

$$b_{n+1}^{(k)} = d_j \cdot z^{rs} \cdot b_n^{(i)} - d_i \cdot z^{rt} \cdot a_n^{(j)} \quad (8),$$

where $a_n^{(j)} = b_m^{(j)}$.

As described above, differences between the Eu method and the BM method can be described as follows:

The BM method: $df_n^{(i)}$ is directly calculated, and $f_{n+1}^{(k)}$ is obtained using the obtained value.

The Eu method: $df_n^{(i)}$ is not directly calculated, and $b_{n+1}^{(k)}$ is obtained as shown in expression (7) using the respective highest-degree coefficients $d_i$ and $d^j$ of polynomials $b_n^{(i)}$ and $b_n^{(j)}$. $f_{n+1}^{(k)}$ is calculated using the same $d_i$ and $d_j$.

From such differences, the following differences are produced in providing apparatuses and high speed for the BM method and the Eu method.

Figure 4A:
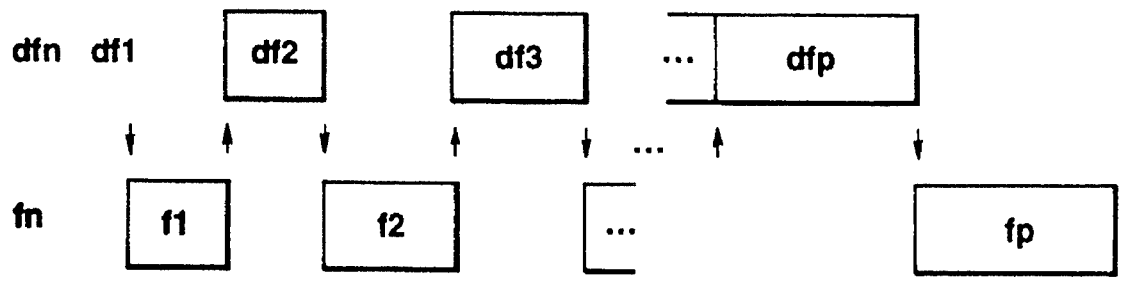
FIGS. 4(a) and 4(b) are diagrams illustrating the operation of the conventional BM method.
Figure 4B:
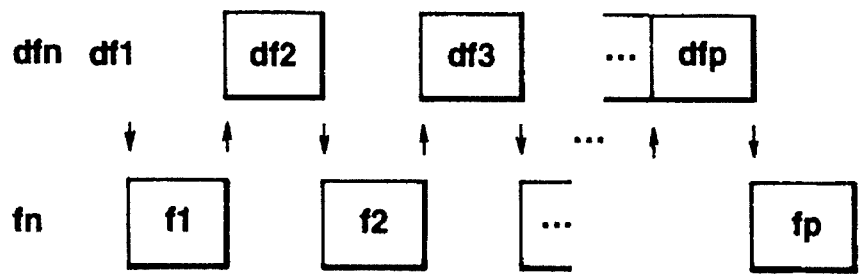

The BM method: In the BM method, it is difficult to calculate both $f_n^{(i)}$ and $f_{n+1}^{(k)}$ in parallel. The reason is as follows: $df_n^{(i)} = d_i$ is necessary for calculating $f_{n+1}^{(k)}$, and $df_n^{(i)}$ is calculated using all the coefficients of $f_n^{(i)}$. Accordingly, since $df_n^{(i)}$ can be obtained only after completing the calculation of $f_n^{(i)}$, the calculation of $f_{n+1}^{(k)}$ can be started only after the calculation of $f_n^{(i)}$ has been completed. Accordingly, as shown in FIG. 4(a), in the BM method, polynomials $f_n^{(i)}$ and $f_{n+1}^{(k)}$ at points n and n+1 are sequentially calculated. In addition, in the BM method, the calculation of $f_n^{(k)}$, $f_{n+1}^{(k)}$ and $df_n^{(i)}$ cannot be executed in parallel even if the calculation is performed with one clock pulse. Hence, as shown in FIG. 4(b), a calculation time equal to about 2 p clock pulses is required. This is the characteristic common to the one-dimensional BM method and the multidimensional Bm method shown in FIG. 2.

Figure 5A:
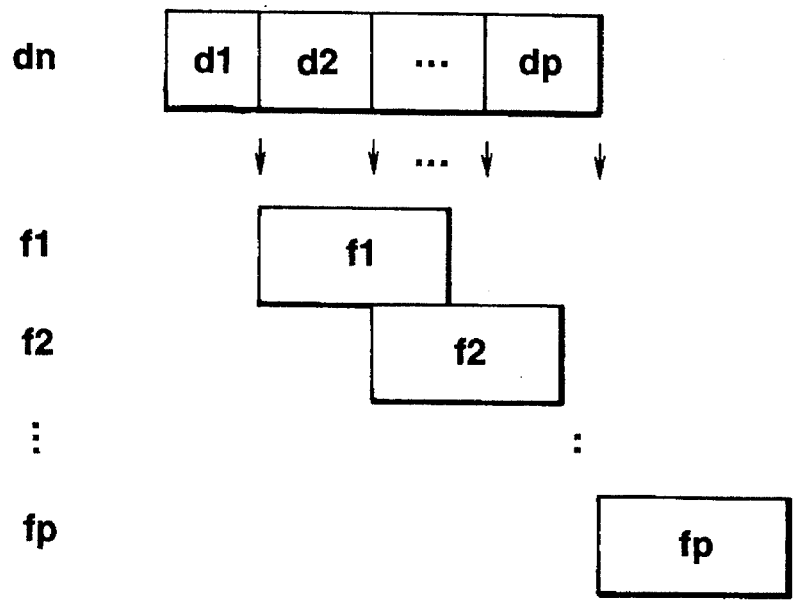
FIGS. 5(a) and 5(b) are diagrams illustrating the operation of the Eu method of the present invention.
Figure 5B:
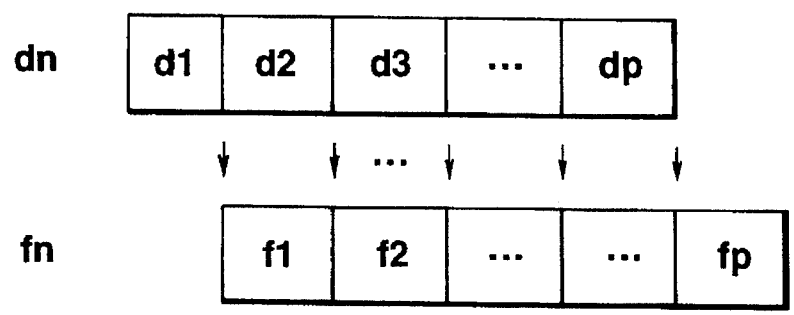

The Eu method: In the Eu method, $f_n^{(i)}$ and $f_{n+1}^{(k)}$ can be calculated in parallel. The reason is as follows: In the Eu method, $d_i$ is the highest-degree coefficient of $b_n^{(i)} \in B$, and polynomials which belong to the B can be calculated only using polynomials which belong to B by expression (7). If it is assumed that expression (7) is sequentially calculated from the highest degree to lower degrees using $b_n^{(i)}$ and $a_n^{(j)}$, output $b_{n+1}^{(k)}$ is sequentially obtained from the highest-degree coefficient to lower-degree coefficients. Hence, the calculation of polynomial $b_{n+2}^{(k)}$ at point n+2 can be started when the highest-degree coefficient has been obtained ($a_{n+1}^{(j)}$ is already obtained polynomials). This indicates that polynomials at points n+1 and n+2 can be calculated in parallel. It is apparent that this also holds for points n and n+1. Accordingly, calculation for updating B can be executed in parallel at respective points. The calculation of $f_{n+2}^{(k)}$ and $f_{n+1}^{(k)}$ can be started when the highest-degree coefficients of $b_{n+1}^{(i)}$ and $b_n^{(i)}$ have been known. Hence, as shown in FIG. 5(a), the calculation of $f_{n+1}^{(k)}$ can also be executed in parallel at respective points. As a result, in the Eu method, if a plurality of processing circuits for performing the calculation of expression (7) are provided, a high-speed operation in proportion to the number of the circuits can be easily performed. This characteristic is common to the well-known one-dimensional Eu method and the multidimensional Eu method shown in FIG. 3, and is absent in the above-described BM method. When the calculation of $b_n^{(i)}$, $b_n^{(k)}$, $f_n^{(i)}$ and $f_{n+1}^{(k)}$ is performed with one clock pulse, as shown in FIG. 5(b), a calculation time equal to about p clock pulses suffices, and therefore a calculation having a higher speed than the BM method can be performed. (In FIGS. 5(a) and 5(b), $d_i$ at point n is represented by $d_n$.)

In general, a high-speed algorithm indicates an algorithm having a smaller amount of calculation. However, for realizing a high-speed operation, an approach to reduce the amount of calculation of the algorithm and an approach to increase the parallel operations of the algorithm can be considered. This is because the processing time can be reduced by simultaneously executing a plurality of processing by parallel processing. A recent progress in the VLSI (very large scale integrated circuit) technique can easily provide a chip which can perform large-scale parallel processing. Accordingly, in many cases, an algorithm having a high degree of parallel processing is suitable for high-speed processing.

As described above, the Eu method of the present invention can perform a higher degree of parallel processing than the BM method, and therefore is suitable for high-speed processing. While the BM method requires two kinds of calculation, i.e., the calculation of polynomial $f_n^{(i)}$ and the calculation of scalar quantity $df_n^{(i)}$, only the same type of calculation shown in expression (7) is required for $f_n^{(i)}$ and $b_n^{(i)}$ in the Eu method. Hence, in the Eu method, the processing circuit can be more easily provided in the form of a unit, and therefore it can be said that the Eu method is more suitable for parallel processing.

As a result, according to the present invention, a high-speed processing apparatus which performs parallel processing can be easily configured.

Fourth Embodiment

Next, a description will be provided of an embodiment in which a N-dimensional BM method is used. In the N-dimensional BM method, addition/subtraction of two points is performed independently for variables of each dimension. For that purpose, in the N-dimensional BM method, more efficient processing can be performed by using N-dimensional memories each of which deals with variables of the corresponding dimension.

Even if calculation relating to (N−1)-dimensional variables is simultaneously performed, processing relating to remaining variables is sequentially performed. Hence, the processes of steps S22 and S24 shown in FIG. 2 can be performed in parallel. In order to simultaneously perform calculation relating to (N−1)-dimensional variables, an independent memory may be used for each degree of the variables, and respective memories may be simultaneously accessed.

Accordingly, in the present embodiment, a method and an apparatus using the method will be proposed, in which independent memories for respective polynomials and respective degrees of variables are realized by dividing addresses of a memory or by using a plurality of memories, thereby processing of the multidimensional BM method is efficiently performed.

Figure 6:
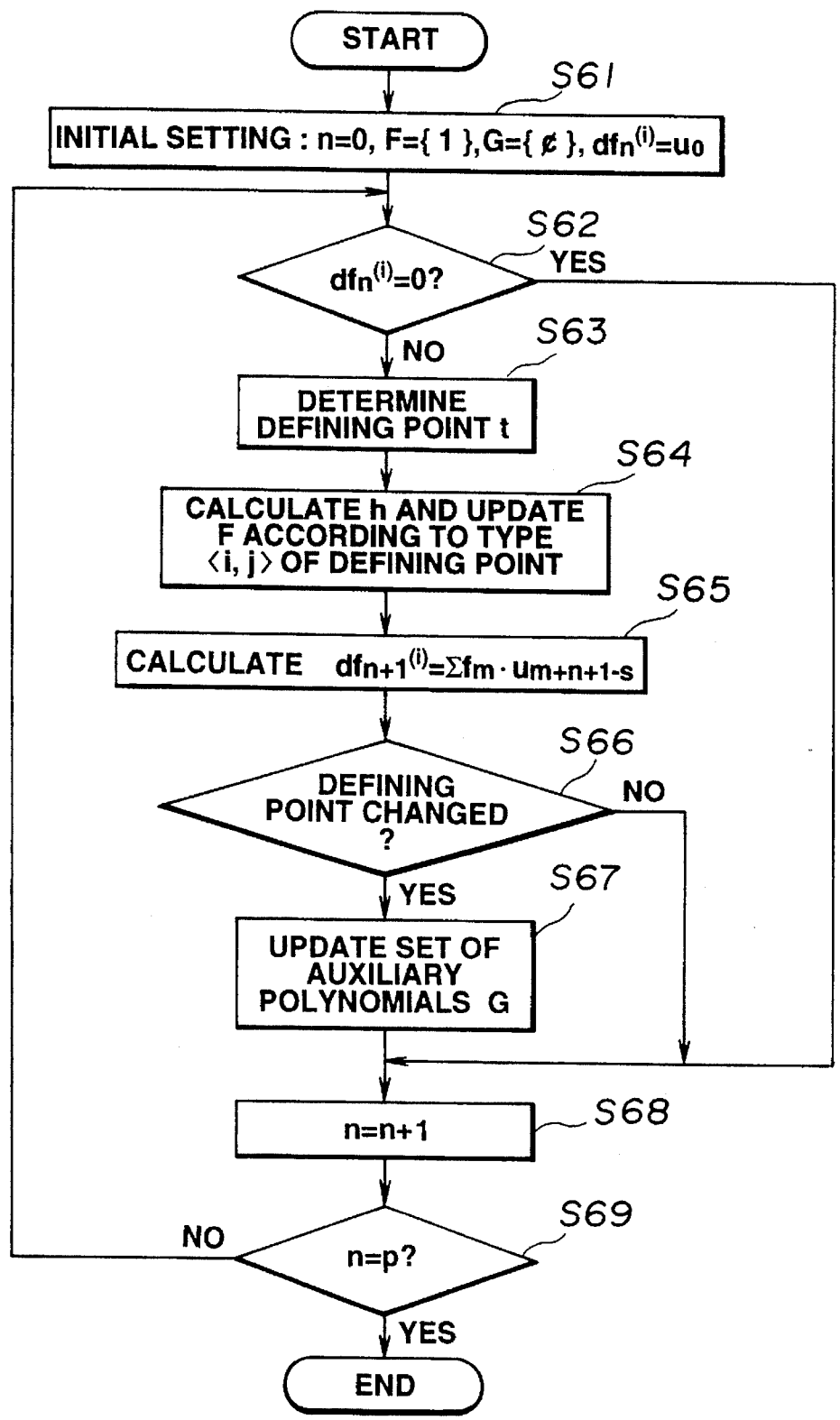
FIG. 6 is an algorithm of a multidimensional BM method according to the present invention.
Figure 7A:
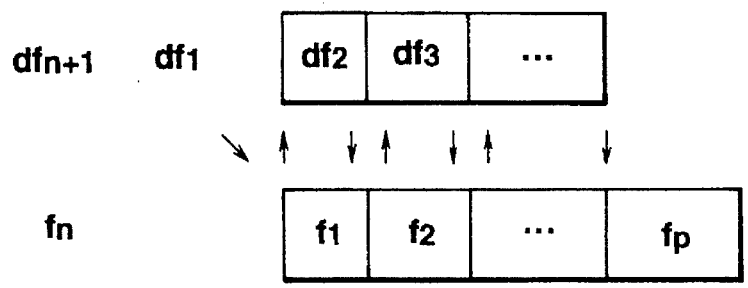
FIGS. 7(a) through 7(c) are diagrams illustrating the operation when the algorithm shown in FIG. 6 is executed.
Figure 7B:
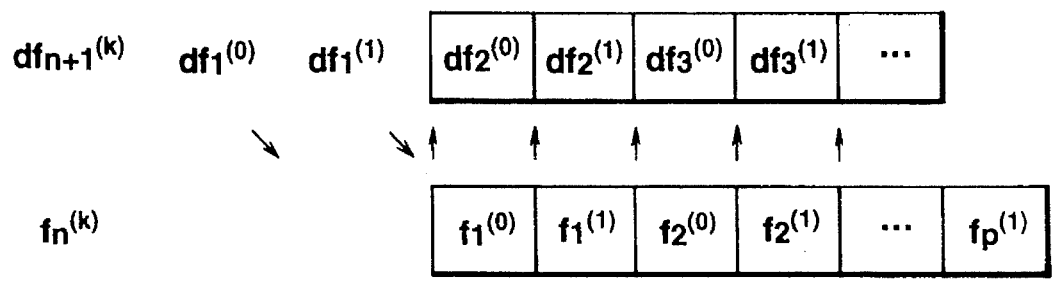
Figure 7C:
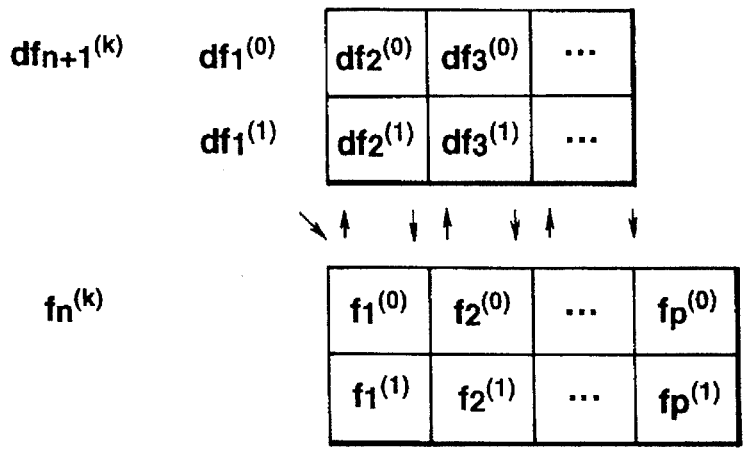

FIG. 6 illustrates an algorithm of the present invention corresponding to the algorithm shown in FIG. 2. FIGS. 7(a) through 7(c) illustrate the operations of the algorithm corresponding to the following fourth through sixth embodiments, respectively. In FIG. 6, the processes of steps S64 and S65 are executed in parallel.

Figure 8:
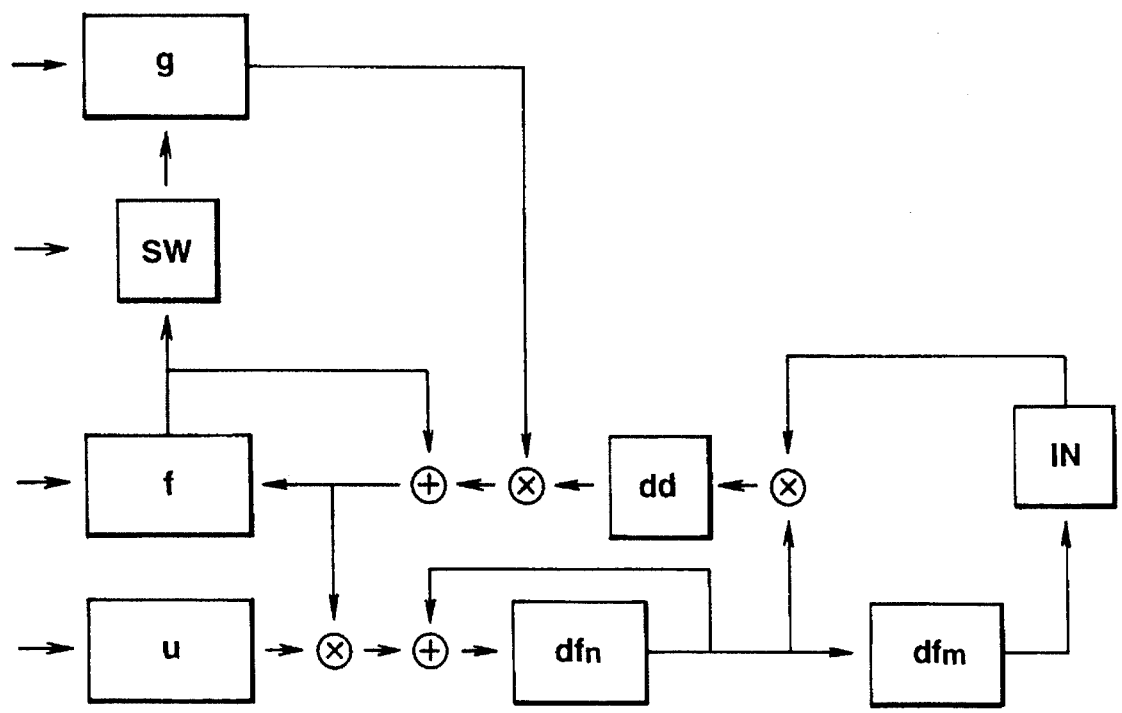
FIG. 8 illustrates a first embodiment of the algorithm shown in FIG. 6.

First, the one-dimensional BM method will be considered. In FIG. 8, symbol u represents a memory for storing a given one-dimensional array u ($u_i$ is set for address i), symbol f represents a memory for storing a minimal polynomial f (having an initial value of 1) for generating array u, and symbol g represents a memory for storing auxiliary polynomial g (having an initial value of 0) for polynomial f. Addresses of these memories are controlled from the outside. Since the one-dimensional BM method is considered, only one polynomial is stored in each of memories f and g. The (s−1)-degree coefficient (s is the highest degree of the polynomial) is set in address i of the memory. Symbol $df_n$ represents a register for calculating $df_n^{(i)}$, symbol $df_m$ represents a register for holding the value of the $df_n$, symbol IN represents a circuit for outputting the reciprocal of an input value, and symbol dd represents a register (having an initial value of $u_0$) for holding the value of $(df_n^{(i)}/df_m^{(j)})$. Symbol SW represents a switch for selecting an output from memory f only when the defining point has changed. Switch SW is controlled from the outside. Symbols × and + represent a multiplier and an adder, respectively.

At point n, the defining point of polynomial f is represented by $s^{(i)}$, and the defining point of polynomial g is represented by $s^{(j)}$. Numbers are sequentially added from address 0 in memories f and g, which are controlled up to addresses $s^{(i)}$ and $s^{(j)}$, respectively. At that time, an external circuit compares the values of $rs+s^{(i)}$ and $rt+s^{(j)}$, starts to operate a memory having a larger value, and operates the other memory after a time period corresponding to the number of clock pulses equal to the difference. As described above, since register dd holds the value of $(df_n^{(i)}/df_m^{(j)})$, respective coefficients of polynomial f at point n calculated and updated by h in step S64 are sequentially input to memory f from address 0 to address $s^{(k)}$ ($s^{(k)}$ is the updated defining point of the polynomial).

At that time, memory u is controlled such that numbers are sequentially subtracted from address n+1 until address $n+1-s^{(k)}$ in accordance with respective coefficients of polynomial f, and respective elements of one-dimensional array u stored therein are sequentially output. Thus, $df_{n+1}^{(k)}$ at point n+1 in 2) is calculated in parallel with f at point n in step S64. At that time, the preceding $df_n^{(i)}$ is input to register $df_m$. By multiplying the reciprocal of the value provided by IN by $df_{n+1}^{(k)}$, value $(df_{n+1}^{(i)}/df_n^{(i)})$ can be held in register dd for the subsequent calculation. However, when the defining point has changed, switch SW is opened, the output of memory f is sequentially input to memory g from address 0 to address $s^{(i)}$, and polynomial g is updated.

Accordingly, in FIG. 8, clock pulses equal to $s^{(k)}$ is required for one updating operation (one cycle) of polynomial f. By repeating this operation p times, minimal polynomial f for generating u can be obtained.

Symbol $s^{(k)}$ is the minimum number of clock pulses when $df_{n+1}^{(k)}$ and respective coefficients of polynomial f are sequentially processed. Hence, in the present invention, useless processing clock pulses are absent in contrast to the apparatus of reference (11), and therefore the speed of processing is increased. Since high speed is not required for the determination and comparison of the defining point, these operations are realized by an ordinary CPU. Accordingly, an external circuit can be easily realized by a CPU and a counter circuit for performing address control.

Fifth Embodiment

The external circuit for performing address control of the memories shown in the fourth embodiment only omits useless processing clock pulses in the one-dimensional BM method. In a BM method for at least two dimensions, however, such an external circuit has an important role for realizing the above-described multidimensional memories by performing address control and for executing an efficient multidimensional BM method.

Figures 9, 10:
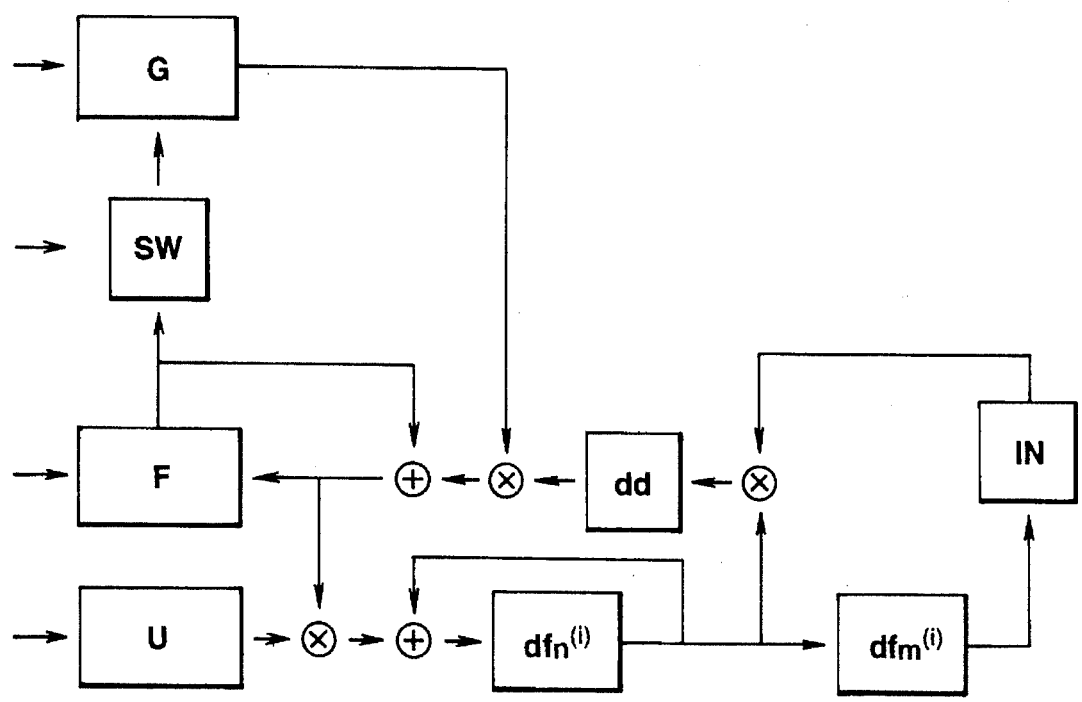
FIG. 9 illustrates a second embodiment of the algorithm shown in FIG. 6.
FIG. 10 is a diagram illustrating address division in a memory.

First, in order to simplify explanation, a two-dimensional BM method will be considered. In FIG. 9, symbol U represents a memory for storing a given multidimensional array u, symbol F represents a memory for storing a plurality of polynomials $f^{(i)}$ (i=0, ..., 1−1) for generating array u, and symbol G represents a memory for storing a plurality of auxiliary polynomials $g^{(j)}$ (j=0, ..., 1−2) for F. Symbol $df_n^{(i)}$ represents a register for calculating $df_n^{(i)}$, and symbol $df_m^{(j)}$ represents a register for holding the value of the above-described $df_n^{(i)}$. A plurality of such registers are required since a plurality of polynomials are present. Other components are the same as those shown in the first embodiment.

If it is assumed that i represents the number of polynomials $f^{(i)}$, j represents the degree of $y_j$, and k represents the degree of $x^{s(i)-k}$ ($s^{(i)}$ is the defining point of polynomial $f^{(i)}$), memories F and G can perform address division as shown in FIG. 10, and the address can be expressed by (i, j, k). Symbol sj shown in FIG. 10 represents the highest degree of x for $y^j$. At that time, if it is assumed that the defining point of one polynomial $f^{(i)}$ in the set of polynomials F is $s^{(i)}=(s1^{(i)}, s2^{(i)})$, and $a=(a1, a2)$ ($a\epsilon\Sigma_0^{s(i)}$) is a variable, polynomial $f^{(i)}$ is stored at the position of address (i, $s1^{(i)}$–a1, a2).

If it is assumed that the defining point of one polynomial $g^{(j)}$ of the set of polynomials G is $s^{(j)}=(s1^{(j)}, s2^{(j)})$, polynomial $g^{(j)}$ is stored in address (j, $s1^{(j)}$–a1, a2) for $a\epsilon\Sigma_0^{s(j)}$. In this case, respective a's used for memories F and G need not conform to the total order, and a1 and a2 can be independently controlled.

For example, first, it may be set such that a1=a2=0, and after operating a1 from 0 to s0, a2 may be carried by one, and thereafter a1 may be again operated from 0 to s1. Accordingly, a1 and a2 can be easily controlled by an ordinary up-counter. As for memory U, address division represented by (j, k) may be performed if mapping un of point n=(n1, n2) is allocated to address (n1, n2), and therefore address control can be easily performed as in the case of memories F and G.

Accordingly, the apparatus shown in FIG. 9 may be operated in the following manner: First, the external circuit compares the magnitude relationship between $rs+s^{(i)}$ and $rt+s^{(j)}$ with respect to the total order calculated from the defining point, operates a memory having a larger value, and outputs polynomials stored in the memory. After the time period corresponding to the number of clock pulses equal to the difference, the external circuit operates the other memory and outputs polynomials stored in that memory.

Since the value of $(df_n^{(i)}/df_m^{(j)})$ is held in register dd, it can be understood that polynomial $f^{(k)}$ having defining point $s^{(k)}=(s1^{(k)}, s2^{(k)})$ calculated and updated by h in step S64 is sequentially input to address (k, s1(k) –a1, a2)($a\epsilon\Sigma_0^{s(k)}$) of memory F. At that time, if the point next to point n in the total order is represented by n+1=n'=(n1', n2'), memory U outputs each element of one-dimensional array u stored in address (n1'–a1, n2'–a2)($a\epsilon\Sigma_0^{s(k)}$) in accordance with variable "a" of updated polynomial $f^{(k)}$ within the address.

Thus, $df_{n+1}^{(k)}$ at point n+1 in step S62 is calculated in parallel with polynomial $f^{(k)}$ at point n in step S64. At that time, $df_{n+1}^{(k)}$ calculated in step S62 is stored in register $df_n^{(i)}$, and the preceding $df_n^{(i)}$ is stored in register $df_m^{(j)}$. The stored values are used in the succeeding calculation whenever necessary. Therefore, the value of $(df_n^{(i)}/df_m^{(j)})$ necessary for the next calculation is held in register dd, and the algorithm shown in FIG. 8 is continuously executed. When the defining point has changed, switch SW is opened, the output of memory F at that time is sequentially input to address (i, $s1^{(i)}$–a1, a2)($a\epsilon\Sigma_0^{s(i)}$) of memory G, whereby the set of polynomials G is updated.

Accordingly, in FIG. 9, $s^{(k)}$ clock pulses are required for updating one polynomial $f^{(i)}$ (one cycle). In the multidimensional BM method, polynomial $f^{(k)}$ calculated in step S14 and k, i and j of polynomials $f^{(i)}$ and $g^{(j)}$ used for that calculation are determined in accordance with the type of the defining point. When a plurality of polynomials are stored while performing address division in the abovedescribed manner, k, i and j of the polynomials can be sequentially selected by assigning addresses. Accordingly, in order to update all polynomials $f^{(k)}$ assigned at point n, the number of clock pulses corresponding to the sum of respective $s^{(k)}$ is required. By repeating the abovedescribed operation up to point p, the set of minimal polynomials F for generating two-dimensional array u can be obtained.

It is apparent that the selection of the polynomials can be executed by an external circuit for determining the defining point. Accordingly, by selecting a plurality of polynomials by address division using an external circuit for controlling addresses, the problem 1) which has been difficult in the conventional apparatus of reference (11) can be solved. Furthermore, the problem of the complication of memory access relating to multidimensional variables described in item 2) is facilitated and can be solved by performing address division for each degree of y, as shown in FIG. 10.

Since each polynomial is updated by the minimum number of clock pulses $s^{(k)}$, it is apparent that efficient processing as in the first embodiment, in which useless processing clock pulses are not provided, is performed.

It is also apparent that the circuit shown in FIG. 9 is also effective for the N-dimensional BM method if the number of division of addresses is increased.

Sixth Embodiment

In the fifth embodiment, since a plurality of polynomials are stored while performing address division of a single memory, only one polynomial and only one degree can be selected, and parallel processing of polynomials and variables shown in problems 3) and 4) is not performed. Accordingly, in the present embodiment, an apparatus for realizing parallel processing of polynomials and variables shown in problems 3) and 4) will be considered.

Figure 11:
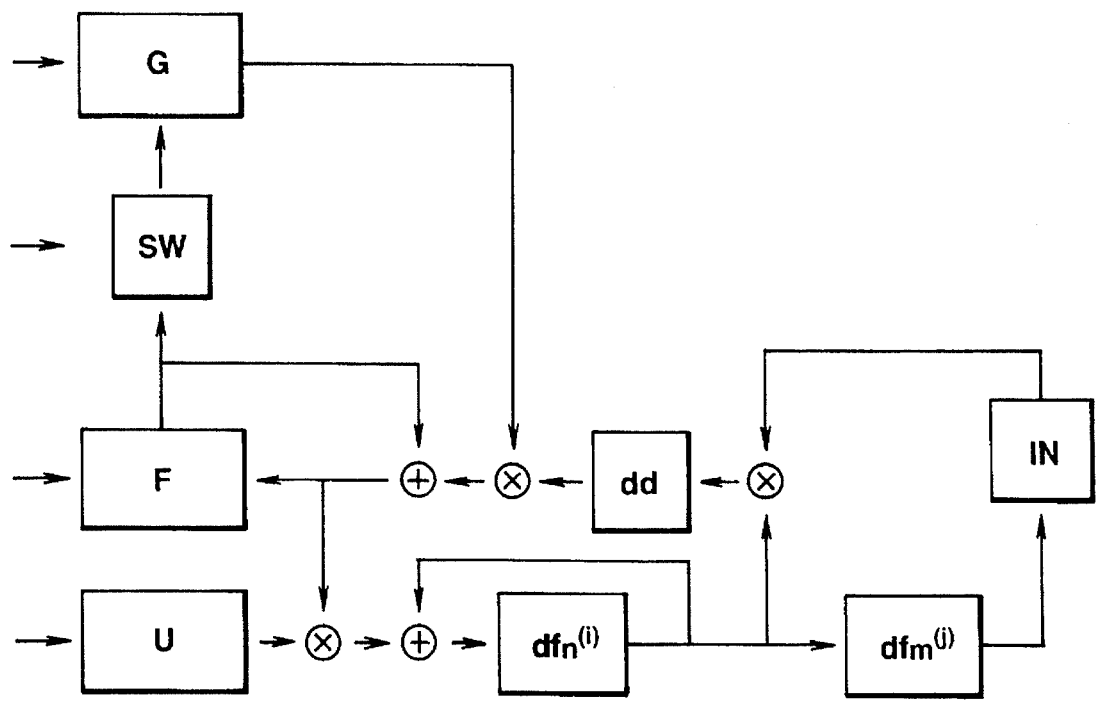
FIG. 11 illustrates a third embodiment of the algorithm shown in FIG. 6.
Figure 12:
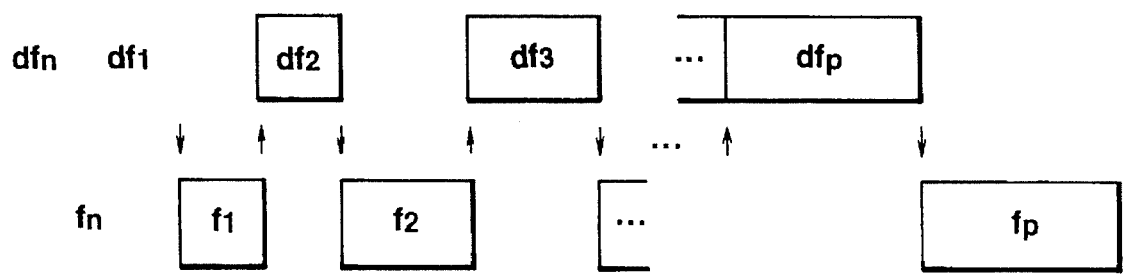
FIG. 12 is a diagram illustrating the operation when the algorithm shown in FIG. 2 is executed.

FIG. 11 illustrates an embodiment of the present invention in which parallel processing of polynomials is realized. In FIG. 11, each of memories F and G comprises a plurality of memories for storing a plurality of polynomials in parallel. The thick line shown in FIG. 11 indicates a multiplex signal line corresponding to the number of the plurality of memories. Symbols + and × indicate a plurality of adders and multipliers, respectively, provided in parallel in accordance with the multiplex signal line. Registers $df_n^{(i)}$, $df_m^{(j)}$, dd and reciprocal generation circuit IN are also provided in parallel in accordance with the multiplex signal line. However, since only one kind of u is stored in memory U and is common to a plurality of polynomials $f^{(i)}$, the input line to memory U comprises a single line, and the output of memory U is input common to multipliers provided in parallel in common.

At that time, if addresses of memories F and G are controlled for polynomials having the largest defining points at each point n, other polynomials can be controlled by the address control. Accordingly, updating of all polynomials at point n can be performed by the number of clock pulses equal to $s^{(k)}$, which is the largest defining point at that point. By repeating the above-described operation p times, the set of minimal polynomials F for generating u can be obtained.

An apparatus for performing parallel processing of variables can also be realized according to the embodiment shown in FIG. 11. In this case, if divided addresses for respective degrees of y of the polynomial of the fifth embodiment are stored in parallel in a plurality of memories, calculation relating to variable y within one polynomial can be performed in parallel. Hence, parallel processing not only for polynomials but also for variables within one polynomial can be realized.

It is apparent that the circuit shown in FIG. 11 is also effective for the N-dimensional BM method if the number of memories is increased.

The number of memories of the apparatus of the sixth embodiment is not necessarily equal to the number of polynomials or the number of degrees, but a plurality of memories which can be provided may be subjected to address division in combination with the case of the second embodiment.

The circuit for performing the processes of steps S82 and S64 can be easily configured by a CPU and the like, and is not limited to the circuit configuration shown in the present embodiment.

The method of storage, the method of access for memories, and the like which have been described above are, of course, efficient not only for the multidimensional BM method, but also for other multidimensional arrays and methods for generating multidimensional polynomials.

In the present invention, since one cycle can be executed with a minimum number of clock pulses $s^{(k)}$ necessary for sequential processing, useless clock pulses are not provided, and the speed of processing is increased.

Furthermore, by controlling a plurality of polynomials and variables thereof using address division, the present invention can also be easily applied to the multidimensional BM method.

In addition, by controlling a plurality of polynomials of the multidimensional BM method in parallel while dividing the polynomials in a plurality of memories, the plurality of polynomials can be processed in parallel, and the processing speed can be increased.

Moreover, by storing divided addresses for respective degrees of variables within each polynomial of the multidimensional BM method in a plurality of memories in parallel, processing for respective variables within one polynomial can be performed in parallel, and therefore the processing speed can be increased.

Although the present invention has been described in its preferred form with a certain degree of particularity, many different embodiments of the invention can be made without departing from the spirit and scope thereof. It is to be understood that the invention is not limited to the specific embodiments thereof except as defined in the appended claims.

What is claimed is:

1. A polynomial-set driving apparatus for obtaining a set of minimal polynomials for generating a given multi-dimensional array, said apparatus comprising:

first storage means for storing a first set of polynomials to be obtained; p1 second storage means for storing a first set of auxiliary polynomials for the first set of polynomials;

third storage means for storing a second set of polynomials different from the first set of polynomials;

fourth storage means for storing a second set of auxiliary polynomials for the second set of polynomials;

first discrimination means for discriminating if the coefficient of a predetermined degree of each polynomial of the second set of polynomials stored in said third storage means equals zero;

determination means for newly determining a defining point if a polynomial, in which the coefficient of a predetermined degree does not equal zero, is found as a result of the discrimination by said first discrimination means;

first derivation means for deriving polynomials which belong to the second set of polynomials based on the value of the defining point determined by said determination means, the second set of polynomials stored in said third storage means, and the second set of auxiliary polynomials stored in the said fourth storage means;

first updating means for erasing all polynomials, in which the coefficient of a predetermined degree does not equal zero, from said third storage means, and for storing the polynomials derived by said first derivation means in said third storage means;

second derivation means for deriving polynomials which belong to the first set of polynomials based on the value of the defining point determined by said determination means, the first set of polynomials stored in said first storage means, the first set of auxiliary polynomials stored in said second storage means, and the coefficient of a polynomial of the second set of polynomials relating to the determined defining point;

second updating means for erasing all polynomials corresponding to the polynomials erased by said first updating means from said first storage means, and for storing the polynomials derived by said second derivation means in said first storage means;

second discrimination means for discriminating the presence of a change of the defining point;

third updating means for updating the first set of auxiliary polynomials stored in second storage means based on the first set of auxiliary polynomials stored in said second storage means, and the polynomials erased by said second updating means, when said second discrimination means has discriminated the presence of a change in the defining point; and fourth updating means for updating the second set of auxiliary polynomials stored in said second storage means based on the second set of auxiliary polynomials stored in said fourth storage means, and the polynomials erased by said first updating means, when said second discrimination means has discriminated the presence of a change in the defining point.

2. A polynomial-set deriving apparatus according to claim 1, wherein the derivation operations by said first and second derivation means are executed in parallel.

3. A polynomial-set deriving apparatus according to claim 1, wherein said first and second derivation means are realized by common circuit means.

4. A polynomial-set deriving apparatus according to claim 1, wherein said second derivation means performs the following calculation:

$$b_q^{(k)} = z^{rs} \cdot b_n^{(i)} - (d_i/d_j) \cdot z^{rt} \cdot b_m^{(j)},$$

where $b_n^{(i)}$ and $b_m^{(j)}$ are polynomials which belong to the second set of polynomials, and $d_i$ and $d_j$ are the coefficients of predetermined degrees of the corresponding polynomials $b_n^{(i)}$ and $b_m^{(j)}$, respectively.

5. A polynomial-set deriving apparatus according to claim 1, wherein said second derivation means performs the following calculation:

$$b_q^{(k)} = d_j \cdot z^{rs} \cdot b_n^{(i)} - d_i \cdot z^{rt} \cdot b_m^{(j)},$$

where $b_n^{(i)}$ and $b_m^{(j)}$ are polynomials which belong to the second set of polynomials, and $d_i$ and $d_j$ are the coefficients of the highest degree or the lowest degree of the corresponding polynomials $b_n^{(i)}$ and $b_m^{(j)}$, respectively.

6. A method for obtaining a set of minimal polynomials for generating a given multidimensional array, said method comprising the steps of:

setting initial values of a first set of polynomials to be obtained, a first set of auxiliary polynomials for the first set of polynomials, a second set of polynomials different from the first set of polynomials, and a second set of auxiliary polynomials for the second set of polynomials in a first, a second, a third and a fourth memory, respectively;

discriminating if the coefficient of a predetermined degree of each polynomial of the second set of polynomials stored in the third memory equals zero;

newly determining a defining point if a polynomial, in which the coefficient of a predetermined degree does not equal zero, is present as a result of the discrimination;

deriving polynomials which belong to the second set of polynomials based on the value of the determined defining point, the second set of polynomials stored in the third memory, and the second set of auxiliary polynomials stored in the fourth memory;

erasing all polynomials in which the coefficient of a predetermined degree does not equal zero, and updating the third memory by storing the polynomials derived by first derivation means;

deriving polynomials which belong to the first set of polynomials based on the value of the determined defining point, the first set of polynomials stored in the first memory, the first set of auxiliary polynomials stored in the second memory, and the coefficient of a polynomial of the second set of polynomials relating to the determined defining point;

erasing all polynomials corresponding to the polynomials erased by the updating operation of the third memory, and updating the first memory by storing the derived polynomials;

discriminating the presence of a change of the defining point;

updating the first set of auxiliary polynomials stored in the second memory based on the first set of auxiliary polynomials stored in the second memory, and the polynomials erased by the updating operation of the first memory, when it has been discriminated that the defining point has changed by the discrimination operation; and updating the second set of auxiliary polynomials stored in the fourth memory based on the second set of auxiliary polynomials stored in the fourth memory, and the polynomials erased by the updating operation of the third memory, when it has been discriminated that the defining point has changed.

7. A polynomial-set deriving method according to claim 6, wherein the derivation operation of the first set of polynomials and the derivation operation of the second set of polynomials are executed in parallel.

8. A polynomial-set deriving apparatus for obtaining a set of minimal polynomials for generating a given multi-dimensional array, said apparatus comprising:

array storage means for storing a given multidimensional array u;

first polynomial storage means for storing a set of polynomials F to be obtained;

second polynomial storage means for storing a set of auxiliary polynomials G for the set of polynomials F;

first calculation means for obtaining polynomials $f^{(k)}$ which belong to the set of polynomials F based on polynomials $f^{(i)}$ stored in said first polynomial storage means, polynomials $g(j)$ stored in said second polynomial storage means, and deviations of polynomials $df_n^{(i)}$;

second calculation means for obtaining deviations of polynomials $df_{n+1}^{(k)}$ based on the coefficients of the polynomials $f^{(k)}$ calculated by said first calculation means and the multi-dimensional array u stored in said array storage means; and control means for controlling accessing operations for said first polynomial storage means, said second polynomial storage means and said array storage means in parallel depending on the degrees of the polynomials $f^{(k)}$, wherein the calculation by said first calculation means and the calculation by said second calculation means are executed in parallel.

9. A polynomial-set deriving apparatus according to claim 8, wherein said first polynomial storage means or said second polynomial storage means includes a plurality of memories, and wherein a plurality of polynomials are stored in different memories.

10. A polynomial-set deriving apparatus according to claim 8, wherein said first polynomial storage means or said second polynomial storage means stores respective variables and respective degrees of a plurality of polynomials are stored at different addresses.

11. A polynomial-set deriving apparatus according to claim 8, wherein said control means controls said first polynomial storage means or said second polynomial storage means so that a plurality of polynomials are stored in different addresses.

12. A polynomial-set deriving apparatus according to claim 8, wherein said control means controls said first polynomial storage means or said second polynomial storage means so that respective variables and respective degrees of a plurality of polynomials are stored in different addresses.

13. A polynomial-set deriving apparatus according to claim 8, wherein said first calculation means performs the following calculation:

$$f^{(k)} = z^{rs} \cdot f^{(i)} - (df_n^{(i)}/df_m^{(j)}) \cdot z^{rt} \cdot g^{(j)}.$$

14. A polynomial-set deriving apparatus according to claim 8, wherein said second calculation means performs the following calculation:

$$df_{n+1}^{(k)} = f_m^{(k)} \cdot u_{m+n+1-s},$$

based on polynomials $f^{(k)} = \Sigma f_m^{(k)} \cdot z_m$ calculated by said first calculation means and the multidimensional array u stored in said array storage means.

15. A method for obtaining a set of minimal polynomials for generating a given multidimensional array, said method comprising the steps of:

storing a given multidimensional array u in an array memory;

obtaining polynomials $f^{(k)}$ which belong to a set of polynomials F to be obtained, based on polynomials $f^{(i)}$ stored in a first polynomial memory for storing the set of polynomials F, polynomials $g^{(j)}$ stored in a second polynomial memory for storing a set of polynomials G different from the set of polynomials F, and deviations of polynomials $df_n^{(i)}$;

obtaining deviations of polynomials $df_{n+1}^{(k)}$ based on the polynomials $f^{(k)}$ obtained by the first calculation operation and the multidimensional array u stored in the array memory; and controlling accessing operations for the first polynomial memory, the second polynomial memory and accessed addresses in parallel depending on the degrees of the polynomials $f^{(k)}$, and executing the first and second calculation operations in parallel.

16. A decoding apparatus comprising:

input means for inputting a coded word;

syndrome generating means for generating a multi-dimensional array corresponding to coefficients of a syndrome polynomial for the coded word;

polynomial generating means for generating an error locator polynomial and an error value polynomial from the multi-dimensional array; and decoding means for decoding the coded word by correcting an error on the basis of an error location and an error value obtained from the error locator polynomial and the error value polynomial, wherein said polynomial generating means includes:
first storage means for storing a first set of polynomials;
second storage means for storing a first set of auxiliary polynomials for the first set of polynomials;
third storage means for storing a second set of polynomials different from the first set of polynomials;
fourth storage means for storing a second set of auxiliary polynomials for the second set of polynomials;
first discrimination means for discriminating if a coefficient of a predetermined degree of each polynomial of the second set of polynomials stored in said third storage means equals zero;
determination means for newly determining a defining point if a polynomial, in which the coefficient of the predetermined degree does not equal zero, is found as a result of the discrimination by said first discrimination means;
first derivation means for deriving polynomials which belong to the second set of polynomials based on the value of the defining point determined by said determination means, the second set of polynomials stored in said third storage means, and the second set of auxiliary polynomials stored in said fourth storage means;
first updating means for erasing all polynomials, in which the coefficient of a predetermined degree does not equal zero, from said third storage means, and for storing the polynomials derived by said first derivation means in said third storage means;
second derivation means for deriving polynomials which belong to the first set of polynomials based on the value of the defining point determined by said determination means, the first set of polynomials stored in said first storage means, the first set of auxiliary polynomials stored in said second storage means, and the coefficient of a polynomial of the second set of polynomials relating to the determined defining point;
second updating means for erasing all polynomials corresponding to the polynomials erased by said first updating means from said first storage means, and for storing the polynomials derived by said second derivation means in said first storage means;
second discrimination means for discriminating the occurrence of a change in the defining point;

third updating means for updating the first set of auxiliary polynomials stored in said second storage means based on the first set of auxiliary polynomials stored in said second storage means, and the polynomials erased by said second updating means, when said second discrimination means has discriminated the occurrence of a change in the defining point; and fourth updating means for updating the second set of auxiliary polynomials stored in said fourth storage means based on the second set of auxiliary polynomials stored in said fourth storage means, and the polynomials erased by said first updating means, when said second discrimination means has discriminated the occurrence of a change in the defining point.

17. A decoding apparatus comprising:

input means the inputting a coded word;

syndrome generating means for generating a multi-dimensional array u corresponding to coefficients of a syndrome polynomial for the coded word;

polynomial generating means for generating an error locator polynomial and an error value polynomial from the multi-dimensional array; and decoding means for decoding the coded word by correcting an error on the basis of an error location and an error value obtained from the error locator polynomial and the error value polynomial, wherein said polynomial generating means includes:
array storage means for storing the multi-dimensional array u;
first polynomial storage means for storing a set of polynomials F to be obtained;
second polynomial storage means for storing a set of auxiliary polynomials G for the set of polynomials F;
first calculation means for obtaining polynomials $f^{(k)}$ which belong to the set of polynomials F based on polynomials $f^{(i)}$ stored in said first polynomial storage means, polynomials $g^{(j)}$ stored in said second polynomial storage means, and derivation of polynomials $df_{n+1}^{(i)}$;
second calculation means for obtaining derivations of polynomials $df_{n+1}^{(k)}$ based on the coefficients of the polynomials $f^{(k)}$ calculated by said first calculation means and the multi-dimensional array u stored in said array storage means; and
control means for controlling accessing operations for said first polynomial storage means, said second polynomial means and said array storage means in parallel depending on the degrees of the polynomials $f^{(k)}$, wherein the calculations by said first and second calculation means are executed in parallel.

* * * * *

UNITED STATES PATENT AND TRADEMARK OFFICE
CERTIFICATE OF CORRECTION

PATENT NO. : 5,535,140
DATED : July 9, 1996
INVENTOR(S) : KEIICHI IWAMURA

It is certified that error appears in the above-identified patent and that said Letters Patent is hereby corrected as shown below:

<u>ON COVER PAGE</u>, Column 1, line 1, and

AT [54] TITLE
    "POLYNOMINAL-SET" should read --POLYNOMIAL-SET--.

AT [56] REFERENCES CITED
    Other Publications, under L.R. Welch and R.A. Scholtz:
    "Algorthm" should read --Algorithm--.

<u>COLUMN 1</u>

Line 1, "POLYNOMINAL-SET" should read --POLYNOMIAL-SET--.
    Line 11, "polynominal-set" should read --polynomial-set--.
    Line 43, "registers" should read --register,--.

<u>COLUMN 3</u>

Line 43, "Constributions" should read --Contributions--.

<u>COLUMN 7</u>

Line 4, "polynominals" should read --polynomials--.

<u>COLUMN 8</u>

Line 20, "$f = \sum_{m \epsilon rf} fm \cdot z^m.$" should read --$f = \sum_{m \epsilon \Gamma f} fm \cdot z^m.$--.

Line 33, "$df_n^{(i)} = \sum_{m \epsilon rf} fm^{(i)} \cdot um+n-s$" should read --$df_n^{(i)} = \sum_{m \epsilon \Gamma f} fm^{(i)} \cdot um+n-s$--.

Line 36, "s For" should read --For--.

UNITED STATES PATENT AND TRADEMARK OFFICE
CERTIFICATE OF CORRECTION

PATENT NO. : 5,535,140
DATED : July 9, 1996
INVENTOR(S) : KEIICHI IWAMURA

It is certified that error appears in the above-identified patent and that said Letters Patent is hereby corrected as shown below:

COLUMN 10

Line 2, "hi" should read --h1--.
Line 43, "=F" should read --b=f--.

COLUMN 11

Line 10, "$1_q^{(k)} \cdot e - c_n^{(i)} \cdot d$" should read --$l_q^{(k)} \cdot e - c_q^{(k)} \cdot d$--.

COLUMN 12

Line 52, "$\Gamma f = \{m \varepsilon \Gamma(a-1) | f \neq 0\}$" should read
--$\Gamma f = \{m \in \Sigma(a-1) | fm \neq 0\}$--.

COLUMN 13

Line 7, "$x^{r1-1+m1-r1(j)}$" should read --$x^{r1-n1+m1-r1(j)}$--.
Line 10, "set-of" should read --set of--.
Line 35, "$F=\{1, y, \ldots, y^{-1}\},$" should read
--$F=\{1, y, \ldots, y^{a-1}\},$--.

COLUMN 14

Line 2, "2and" should read --2 and--.
Line 13, "$b^{(i)}=f^{(i)}19u$" should read --$b^{(i)}=f^{(i)} \cdot u$--.
Line 31, "memory" should read --memory 13,--.

COLUMN 15

Line 7, "FIG." shoudl read --FIG. 1--.

UNITED STATES PATENT AND TRADEMARK OFFICE
CERTIFICATE OF CORRECTION

PATENT NO. : 5,535,140
DATED : July 9, 1996
INVENTOR(S) : KEIICHI IWAMURA

It is certified that error appears in the above-identified patent and that said Letters Patent is hereby corrected as shown below:

COLUMN 16

Line 5, "$d^j$" should read --$d_j$--.
Line 54, "$b_n^{(k)}$," should read --$b_{n+1}^{(k)}$,--.

COLUMN 18

Line 31, "is" should read --are--.

COLUMN 19

Line 49, "FIG. 8" should read --FIG. 6--.

COLUMN 21

Line 1, "S82" should read S62--.
Line 40, "obtained; p1 second" should read --obtained; ¶ second--.

UNITED STATES PATENT AND TRADEMARK OFFICE
CERTIFICATE OF CORRECTION

PATENT NO. : 5,535,140
DATED : July 9, 1996
INVENTOR(S) : KEIICHI IWAMURA

Page 4 of 4

It is certified that error appears in the above-identified patent and that said Letters Patent is hereby corrected as shown below:

<u>COLUMN 26</u>

Line 17, "means the" should read --means for--.

Signed and Sealed this

Eleventh Day of February, 1997

Attest:

BRUCE LEHMAN

Attesting Officer    Commissioner of Patents and Trademarks